United States Patent
Aurongzeb et al.

(10) Patent No.: US 10,747,263 B2
(45) Date of Patent: Aug. 18, 2020

(54) SYSTEM FOR COLOR AND BRIGHTNESS OUTPUT MANAGEMENT IN A DUAL DISPLAY DEVICE

(71) Applicant: Dell Products, LP, Round Rock, TX (US)

(72) Inventors: Deeder M. Aurongzeb, Austin, TX (US); Lawrence E. Knepper, Leander, TX (US)

(73) Assignee: Dell Products, LP, Round Rock, TX (US)

( * ) Notice: Subject to any disclaimer, the term of this patent is extended or adjusted under 35 U.S.C. 154(b) by 143 days.

(21) Appl. No.: 15/912,913

(22) Filed: Mar. 6, 2018

(65) Prior Publication Data
US 2019/0278323 A1   Sep. 12, 2019

(51) Int. Cl.
| | |
|---|---|
| *H01L 27/32* | (2006.01) |
| *G06F 1/16* | (2006.01) |
| *G06F 3/0488* | (2013.01) |
| *G06F 3/041* | (2006.01) |

(52) U.S. Cl.
CPC .......... *G06F 1/1616* (2013.01); *G06F 1/1643* (2013.01); *G06F 3/0416* (2013.01); *G06F 3/04886* (2013.01); *H01L 27/323* (2013.01); *H01L 27/3211* (2013.01); *G09G 2320/046* (2013.01)

(58) Field of Classification Search
CPC ............................. H01L 27/32; H01L 27/3211
See application file for complete search history.

(56) References Cited

U.S. PATENT DOCUMENTS

| | | | |
|---|---|---|---|
| 6,414,661 B1 | 7/2002 | Shen | |
| 7,470,569 B2 | 12/2008 | Cok | |
| 7,859,501 B2 | 12/2010 | Levey | |
| 8,237,750 B2 | 8/2012 | Polak | |
| 9,515,279 B2 * | 12/2016 | Ishisone | .............. H01L 51/5016 |
| 2006/0006328 A1 | 1/2006 | Cao | |
| 2006/0092183 A1 | 5/2006 | Malmburg | |
| 2008/0266332 A1 | 10/2008 | Inoue | |

* cited by examiner

*Primary Examiner* — Antonio A Caschera
(74) *Attorney, Agent, or Firm* — Prol Intellectual Property Law, PLLC; H. Kenneth Prol

(57) ABSTRACT

A dual display housing information handling system and method comprising a first display screen side having a first portion or first display panel of a display screen, a second display screen side, hinged to the first display screen side, having a second portion or a second display panel of the display screen, and a second display screen side RGB detector to activate and the first display to test flash and a first display screen side RGB detector to activate and the second display to test flash and. A controller to determine operating color temperature shift for comparison to detect burn-in differences from color temperature readings by the first display screen side RGB detector and the second display screen side RGB detector, and if the difference between operating color temperatures measured between the first portion of the display screen and second portion of the display screen reaches a threshold difference, the controller implementing display color shift management to provide adjusted color mapping data to adjust at least one color component of the first or second display screen side to balance the operating color temperatures between the first portion of the display screen and second portion of the display screen.

20 Claims, 11 Drawing Sheets

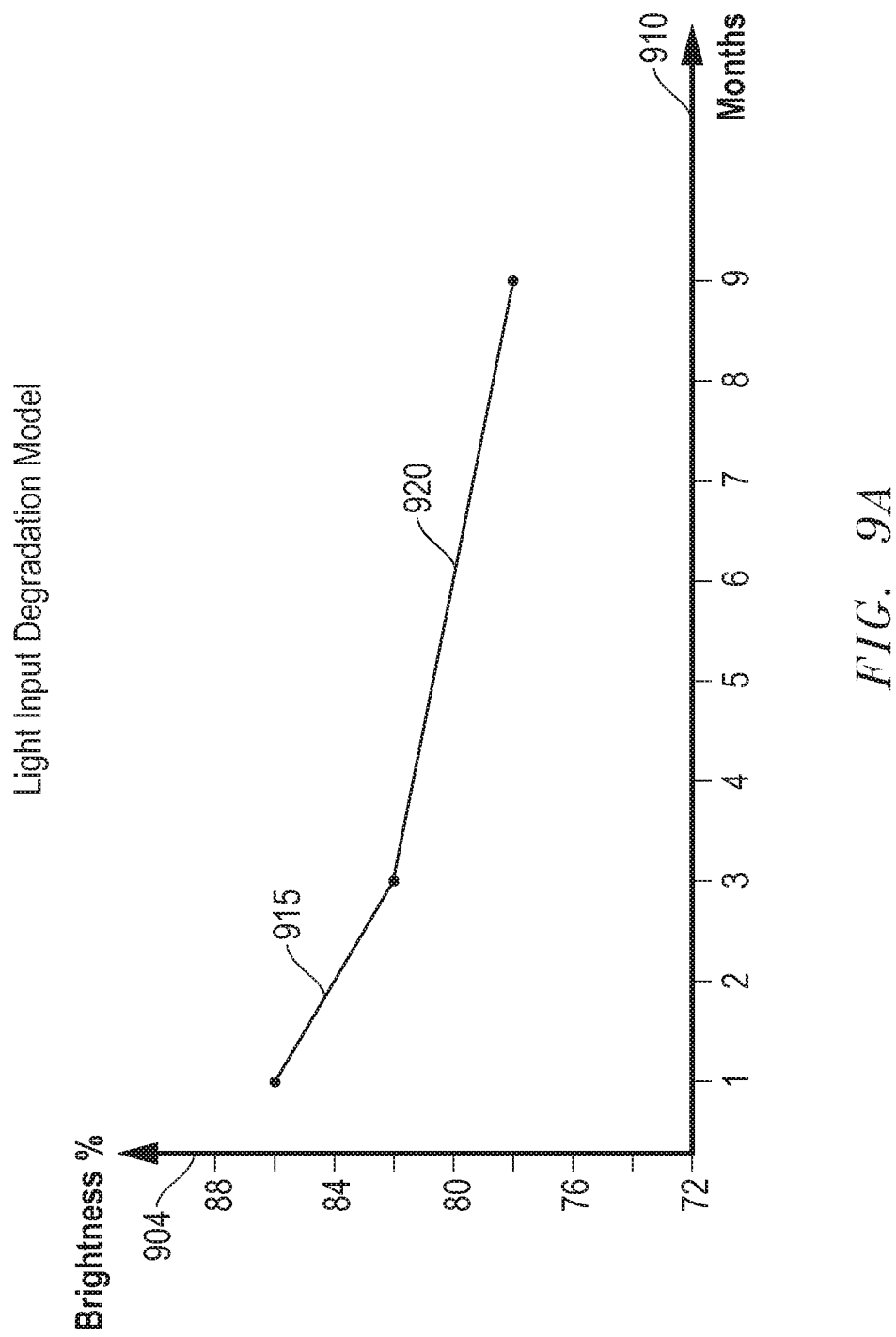

SYSTEM FOR COLOR AND BRIGHTNESS OUTPUT MANAGEMENT IN A DUAL DISPLAY DEVICE

FIELD OF THE DISCLOSURE

The present disclosure generally relates to displays for information handling systems, and more particularly to managing brightness and color output variation that may arise over time in a dual display information handling system, and in particular, a dual organic light emitting diode (OLED) system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. An information handling system may include a dual display screens which may be hinged such that the dual display screen device is reconfigurable to a number of user mode configurations or may include a bendable or foldable display for displaying user output and receiving user input that may span two display screen housing reconfigurable with respect to one another.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which:

FIG. 9A illustrates a graphical plot illustrating example dual display information handling system color shift model for color brightness levels for a display screen according to an embodiment of the present disclosure;

The use of the same reference symbols in different drawings indicates similar or identical items.

DETAILED DESCRIPTION OF DRAWINGS

Figure 1:
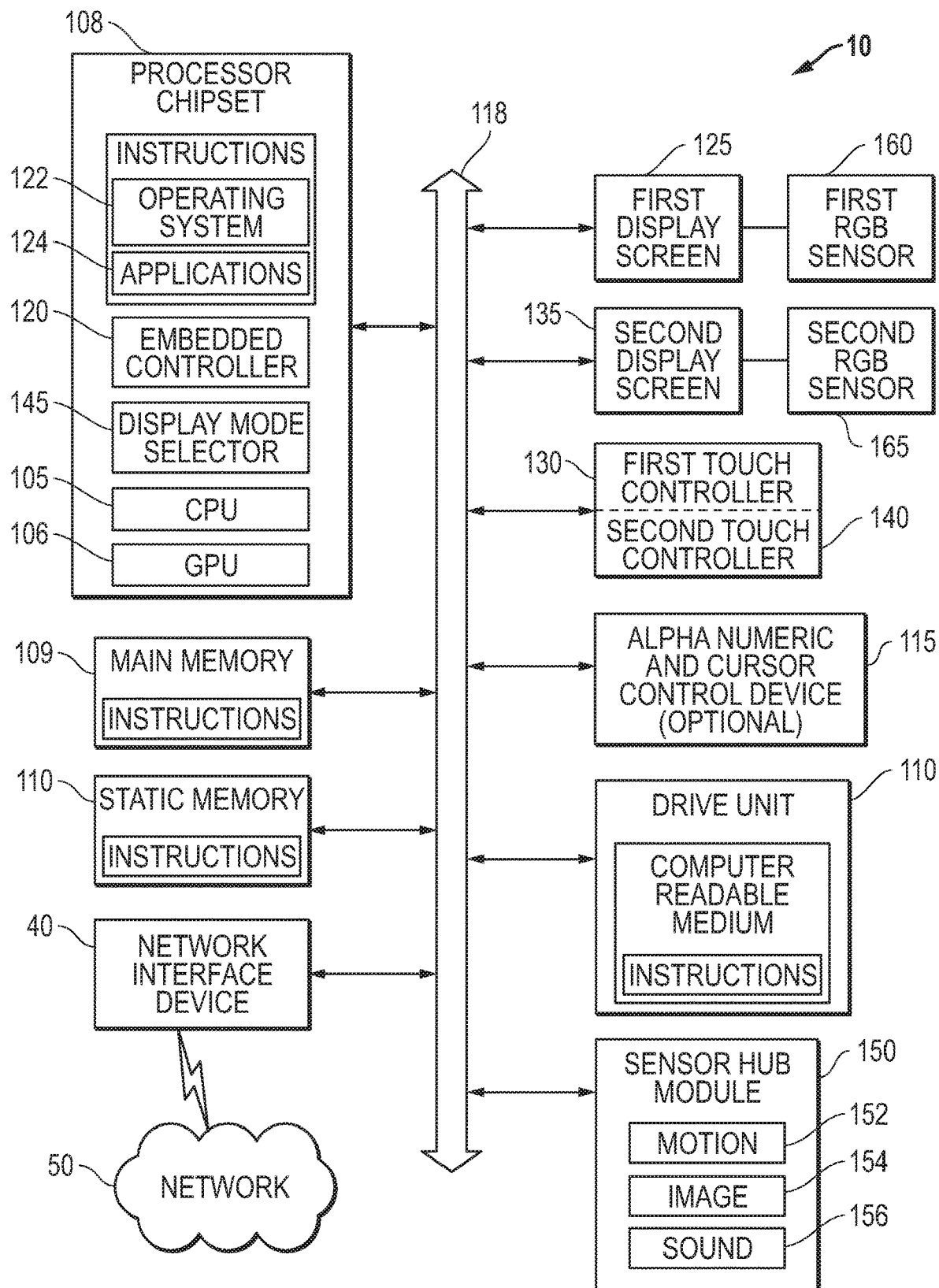
FIG. 1 is a hardware block diagram illustrating a dual display information handling system according to an embodiment of the present disclosure.

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings may be utilized in this application, as well as in other applications and with several different types of architectures such as distributed computing architectures, client or server architectures, or middleware server architectures and associated components.

Most businesses and other enterprises have sophisticated computing systems used for facilitating internal operations and for storing sensitive data, protecting access to such data, and securely communicating outside the enterprise's network, for example to exchange information with business partners, healthcare providers or the similar data exchange partners. These enterprise systems also interface with individual users. Individual users also use sophisticated computing systems to facilitate working software application contexts such as running office applications for database creation and word processing, note taking, accessing internet data applications, gaming, video playback entertainment, video and voice communications, email and other electronic communication, websurfing, music, mobile applications, and other media accesses. Much of present day information exchange is conducted electronically, via communications networks. Currently, a high degree of media entertainment and other applications are utilized and accessed electronically by users. Thus, there is an increased need for extended display capabilities to facilitate broad range of usage including to enable multitasking by users. Additionally, traditional information handling system input devices such as keyboards and mouse systems are giving way to visual input interfaces such as touchscreens, hover detection, and motion sensing technologies. In many instances, it is substantially beneficial to implement a system with multiple display screens to interact with an information handling system.

Display screens, or portions of display screen such as a flexible display screen utilized across two reconfigurable display housings, however may require a burn-in period and may also experience substantial brightness dependent color shifts over time with use. A dual display information handling system may include two or more display screen sides which may be two or more separate display panels mounted in two or more display screen housings reconfigurable around a hinged side or a single display screen that is flexible and mounted across two or more display screen housings where portions supported on the reconfigurable display screen housings may be treated as plural display screen sides. In an example aspect, burn-in with organic light emitting diode (OLED) displays may have brightness dependent color shifts that occur over time at different rates as to red, green, or blue components of pixels in the display. The result is a color shift over time to the color temperature of the display when displaying some or all colors. For example, a display of white will shift depending on which color component degrades in brightness. A reduction in blue will provide a warmer color temperature of white. A reduction or some or both of red or green may result in a cooler color temperature of a white display. The color shifts may be varied due to usage of one display screen side of a reconfigurable dual display information handling system more than another display screen side in some aspects. Color shift variation may occur due to one display screen side of a dual display information handling system experiencing different thermal temperatures due to location of CPU and GPU processors or orientation relative to sunlight or external factors that may accelerate color component degradation. Another factor may include variation of display screen side usage of dual display information handling systems due to preferred usage configurations implemented causing greater usage or one display screen side over the other. Yet another factor may include frequently used application programs implementing different graphics intensity levels on the display screen sides differently, such as for example a software application where one display screen side may be used for a virtual keyboard or other virtual input interface while the other display screen side utilizes high levels of display brightness levels over time. Further, angles of usage, local stress conditions due to folding of foldable displays, and application programs used may also have impacts on color shifts that occur over time with usage and burn-in of dual display information handling systems.

In other aspects, display utilization may vary across portions of the display screen differently. For example, an OLED display panel may experience pixel burn-in effects differently even across one single display screen side of the dual display information handling system differently depending on software applications utilized where the graphics intensity of application programs used may disproportionately utilize some parts of the display screen at a higher level than other portions in some embodiments. For example, some graphics intensive software applications may utilize pixels in a center of the display screen at a greater level than along the periphery of a display screen. In other examples, graphics intensive software applications may utilize pixels along the sides of a display screen for graphics supporting task bars, control menus, or other features at a different rate than pixels at other locations across the same display screen side. Thus, variation between sides of a display screen may also include variations among corresponding sections or portions of display screens in each display screen side of a dual display screen information handling system.

Such variation may result in the display screen sides of a dual display information handling system or even portions of each display screen side to experience color shifts differently. This variation of burn-in color shift impacts user experience with such dual display information handling systems. Different brightness or colors between sides of a dual display information handling system may be an undesirable result for operation. Further, detection of orientation of a dual display information handling system and the context of the applications running thereon may be beneficially used to determine when or how much color shift adjustment may need to be made by a color and brightness color shift management system to enhance the performance of these displays as described in several embodiments herein.

FIG. 1 shows a dual display information handling system 10 including information handling systems components for use with client/server computing environments. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a tablet, a PDA/smartphone, a consumer electronic device, a network server or storage device, a switch router, wireless router, or other network communication device, or any other suitable device and may vary in size, shape, performance, functionality, and price. The information handling system may include memory, one or more processing resources such as a central processing unit (CPU) 105 and related chipset(s) 108 or hardware or software control logic. Additional components of system 10 may include main memory 109, one or more storage devices such as static memory or disk drives 110, an optional external input device 115 such as a keyboard, and a cursor control device such as a mouse, or one or more dual video display screen sides 125 and 135. The information handling system may also include one or more buses 118 operable to transmit communications between the various hardware components.

More specifically, system 10 represents a mobile user/client device, such as a dual screen mobile tablet computer. System 10 has a network interface device 40, such as for wireless cellular or mobile networks (CDMA, TDMA, etc.), WIFI, WLAN, LAN, or similar network connection, enabling a user to communicate via a wired or wireless communications network 50, such as the Internet. System 10 may be configured with conventional web browser software. The web browser, may include for example Microsoft Corporation's Internet Explorer web browser software, Firefox or similar such browsers to allow the user to interact with websites via the wireless communications network 50.

System 10 may include several sets of instructions to be run by CPU 105 and any embedded controllers 120 on system 10. One such set of instructions includes an operating system 122 with operating system interface. Example operating systems can include those used with typical mobile computing devices such as Windows and Windows mobile OS from Microsoft Corporation and Android OS from Google Inc. Additional sets of instructions in the form of multiple software applications 124 may be run by system 10. These software applications 124 may enable multiple uses of the dual display information handling system as set forth in more detail below.

System 10 includes a first or primary display screen sides 125 and a second display screen side 135. In particular embodiments of the present disclosure, first display screen side 125 and second display screen side 135 may be organic light emitting diode (OLED) type displays screens, light emitting diode (LED) display screens, liquid crystal displays (LCD), electroluminescent displays (ELD), or other types of display technologies according to various disclosures. Even within one display technology such as OLED, several options may exist including AMOLED or PMOLED. With respect to time-based color shifts experienced by display screen types, variations in color shift occurrence over burn-in periods may occur between manufacturers and models of display screens. The present disclosure describes systems and methods that address those burn-in color shifts that may occur. The burn-in color shifts may be experienced as changes in hue or brightness of light emanating from one or both display screen sides 125 and 135.

Each display screen has a display driver operated by one or more graphics processing units (GPUs) such as those that are part of the chipset 108. Information handling system 10 includes one or more display screen panels or a flexible panel across the first display screen 125 and second display screen 135. Each of these panels is communicatively coupled to controller 120 in the processor chipset or a graphics subsystem. The graphics subsystem may contain controllers as well as a graphics processor unit (GPU) 106 which are enabled for executing machine-readable instructions to carrying out methods and systems according to disclosed embodiments of portions of the dual display color shift management system.

Graphics subsystem including controllers and GPU 106 include memory with one or more color tables used to provide display data for display on display screen panels or portions of a flexible display screen panel for first and second display screen sides 125 and 135. In accordance with disclosed embodiments, a graphics subsystem changes graphics data used for display screen sides 125 and 135 that may be adjusted based on burn-in brightness variation determined by the dual display color shift management system. In an example embodiment, color shift or color offsets between the display screen sides 125 and 135 may take place. In other example embodiments, sub-arrays of pixels within the display screen sides 125 and 135 experience brightness or color distortion differently during burn-in usage. In some embodiments, brightness of pixels, pixel arrays, or entire display screen sides may be altered to accommodate color shift distortion due to variations of burn-in over time.

As described, a graphics subsystem memory may include one or more color tables which include display data (e.g., color data, brightness data) used by a display pipe to provide data to one or more display screen panels of display screen sides 125 and 135. In various embodiments, the color tables include information for each panel stored per pixel, per zone, or per region. In addition or instead, color maps may be used instead of tables and can include the same or similar display data. Color tables or color maps may be used interchangeably and illustrations in described examples and not intended to limit the claimed subject matter.

In a particular embodiment, color tables may be recalibrated to each contain a color gamut (e.g., with color offsets) for specific color shift adjustment measures to equalize brightness or color variations such as between display screen sides 125 and 135. In some embodiments, the various color tables are indexed and selected for a particular burn-in brightness degradation scenarios based on operating conditions or accumulated "on" times according to the type, amount, and location of usage levels detected by the dual display color shift management system.

A display pipe for a graphics subsystem processes display data for the display screen panel or panels of display screen sides 125 and 135, including in some embodiments by providing an accumulation and blending of multiple layers of images into a composite image. In an example embodiment, display pipe may be a processor or processor subsystem in the graphics subsystem executing instructions to accumulate or blend images among other functions described herein with respect to the image corrections made according to these disclosures. Video frames stored in frame buffer may be represented by RGB color information, and display pipe is enabled to access image frame information from memory accessible to the graphic subsystem. Controller 120 and GPU 106 may execute machine readable instructions to buffer data within the memory or other storage. In one embodiment, the display pipe sends graphics information and video data with transformed color mapping information for display on one or more portions of the display screen sides 125 or 135 based on direction to use one or more color tables including recalibrated color tables. In addition or instead, controller 120 and GPU 106 execute instructions to perform RGB color mapping, provide RGB data for frame buffering, and substitute the RGB data for affected regions or display screen sides in accordance with some disclosed embodiments. GPU 106, controller 120, and the other elements in the FIG. 1 are illustrated in simplified form, which is not intended to limit the subject matter of the claims. For example, several embedded controller 120 may exist, some of which support the graphics subsystem and other which serve different purposes of the dual display information handling system. Accordingly, these components may act as memory controllers, perform memory input/output (IO), and so on as required by disclosed embodiments.

Each display screen side 125 and 135 also has an associated touch controller 130, 140 to accept touch input on the touch interface of each display screen. It is contemplated that one touch controller may accept touch input from display screens 125 and 135, or as shown in the current embodiment, two touch controllers 130 and 140 may operate each display screen respectively. These touch controllers 130 or 140 may further include digitizer systems for use with stylus systems in some embodiments. In one embodiment, the first touch controller 130 is associated with the first display screen side 125. The second touch controller 140 is associated with the second display screen side 135.

The first display screen side 125 and the second display screen side 135 may also be controlled by the embedded controller 120 of chipset 108. For example, the power to the first display screen side 125 and the second display screen side 135 is controlled by an embedded controller 120 in the processor chipset(s) which manages a battery management unit (BMU) as part of a power management unit (PMU) in the BIOS/firmware of the main CPU processor chipset(s). These controls form a part of the power operating system. The PMU (and BMU) control power provision to the display screens and other components of the dual display information handling system.

A first RGB sensor 160 and a second RGB sensor 165, in connection with a color shift management system as described in more detail below, determines what color shift adjustments to deploy for unequal levels of color or brightness burn-in between display screens or portions of display screen sides 125 and 135. The color shift management system may operate via the embedded controller 120 and implementation may be based upon orientation of the two display screen sides 125 and 135 as well as the software applications 124 currently running and active. Determining which applications 124 are running determines a working software application context. Alternatively, the color shift management system may operate on a controller 120 separate from the main CPU chipset(s) 108 or may operate as an application operating on the CPU 105 or GPU 106 in other embodiments. Additionally, the color shift management system may receive state of usage activity input from device state sensors. A display mode selector 145 may further detect which orientations one or more display housings may have in relation to one another via detection from sensor systems and a sensor hub 150. Such detection of orientation may be used to determine configuration of display housings with respect to one another via detected sensor feedback and may be used with embodiments herein when assessing time of operation between display screen sides 125 and 135 or in determination of the need for application of color shift adjustments by the color shift management system. First RGB sensor 160 and a second RGB sensor 165 may be color sensors mounted on opposite display screen housings in some embodiments. The first RGB sensor 160 may detect color brightness levels of color components of the operation, such as via a test flash, of the second display screen side 135 opposite the first display housing. Similarly, second RGB sensor 165 may detect color brightness levels of color components of the operation, such as via a test flash, of the first display screen side 125 opposite the second display housing. In some embodiments, the RGB sensors 160 and 165 may be a single sensor for detection of general color brightness levels from the opposite display screen sides 125 and 135. RGB sensors may be mounted in the display housings or, in some embodiments, behind display screen sides 125 and 135 respectively.

In yet other embodiments, M×N RGB sensors 160 and 165 may be used. M×N RGB sensor in some embodiments may be a sensor array which may be mounted in the display screen housing behind the display screen. The M×N RGB sensor may then detect pixel array locations from a display screen directly across from the M×N RGB sensor when the display screen sides 125 and 135 are facing or nearly facing one another such as when the display screen housings are in a near closed usage configuration. Again, the opposite display screen may issue a test flash, such as a white flash in some embodiments, upon reaching a near closed usage configuration while the M×N RGB sensor in the opposite display housing may be activated to detect color brightness levels of corresponding pixel array locations in the opposite display screen. In some embodiments, the facing display screen side 125 and M×N RGB sensor 165 as well as the facing display screen side 135 and M×N RGB sensor 165 may detect color brightness levels at corresponding mirror-image locations opposite one another. The size of pixel arrays may be of any size corresponding to elements of the M×N RGB sensors such that each sensor element in an M×N RGB sensor array may be responsible for any size pixel array in the opposite display screen and may further record color brightness of pixel arrays of differing dimensions in some embodiments. It is further understood that, in some embodiments, display screen sides 125 and 135 may be portions of a single, flexible display screen that spans multiple reconfigurable display screen housings. Thus, the RGB sensors 160 and 165 may detect the color brightness of display screen sides 125 and 135 of a flexible display screen.

System 10 of the current embodiment has a system sensor module 150. Various orientation sensors are included in this module to assist with determining the relative orientation of the dual display information handling system. Subcategories of orientation sensors include motion sensors 152, image sensors 154, and sound sensors 156. Other orientation sensors are contemplated as well including state of usage activity sensors as discussed in more detail below with FIG. 2. Sensor system module 150 is a sensor hub, or an accumulator device, that collects raw data from connected orientation sensors, and organizes and processes data received from the connected sensors. The sensor hub also processes raw sensor data to groom the raw sensor data into a useable form of positional analysis for the dual display information handling system and its display screens. Such a sensor hub may be an independent microcontroller such as the STMicro Sensor Fusion MCU as well as other microcontroller processing systems known to persons of ordinary skill. Alternatively, it is contemplated that the sensor and fusion hub may be integrated into a core processing chipset such as CPU systems for mobile devices as available from Intel® corporation or may utilize ARM Core processors that serve as single or multiple core processors in alternative chipset systems. The sensor hub may communicate with the sensors and the main CPU processor chipset via a bus connection such as an Inter-Integrated Circuit (I2C) bus or other suitable type of multi-master bus connection.

The sensor data from the sensor hub is then further groomed by the display mode selector 145 to assess display screen utilization differences or the need for color shift management measures according to disclosures herein. A relative orientation of the dual display information handling system in space, the orientation of the two display screens with respect to one another, consideration of state of usage activity data, and working software application context are determined by the display mode selector 145 at CPU 105 and embedded controller 120 for use with the color shift management system according to embodiments herein. This relative orientation data of the dual display information handling system, the state of usage activity data, and the working software application context are used by the color shift management to determine color shift adjustment measures to be taken to minimize the effects of burn-in variations between display screen sides 125 and 135 or even for variations over single display screen side in some aspects.

Typically, system 10 may also include microphones and speakers for audio input and output (not shown). The microphones and speakers are connected through an HDA Codec such as the Realtek ALC 5642 or similar such codec. Data from the microphones may serve motion sensing using a Doppler Effect detection of display screen locations. This is discussed further below.

Figure 2:
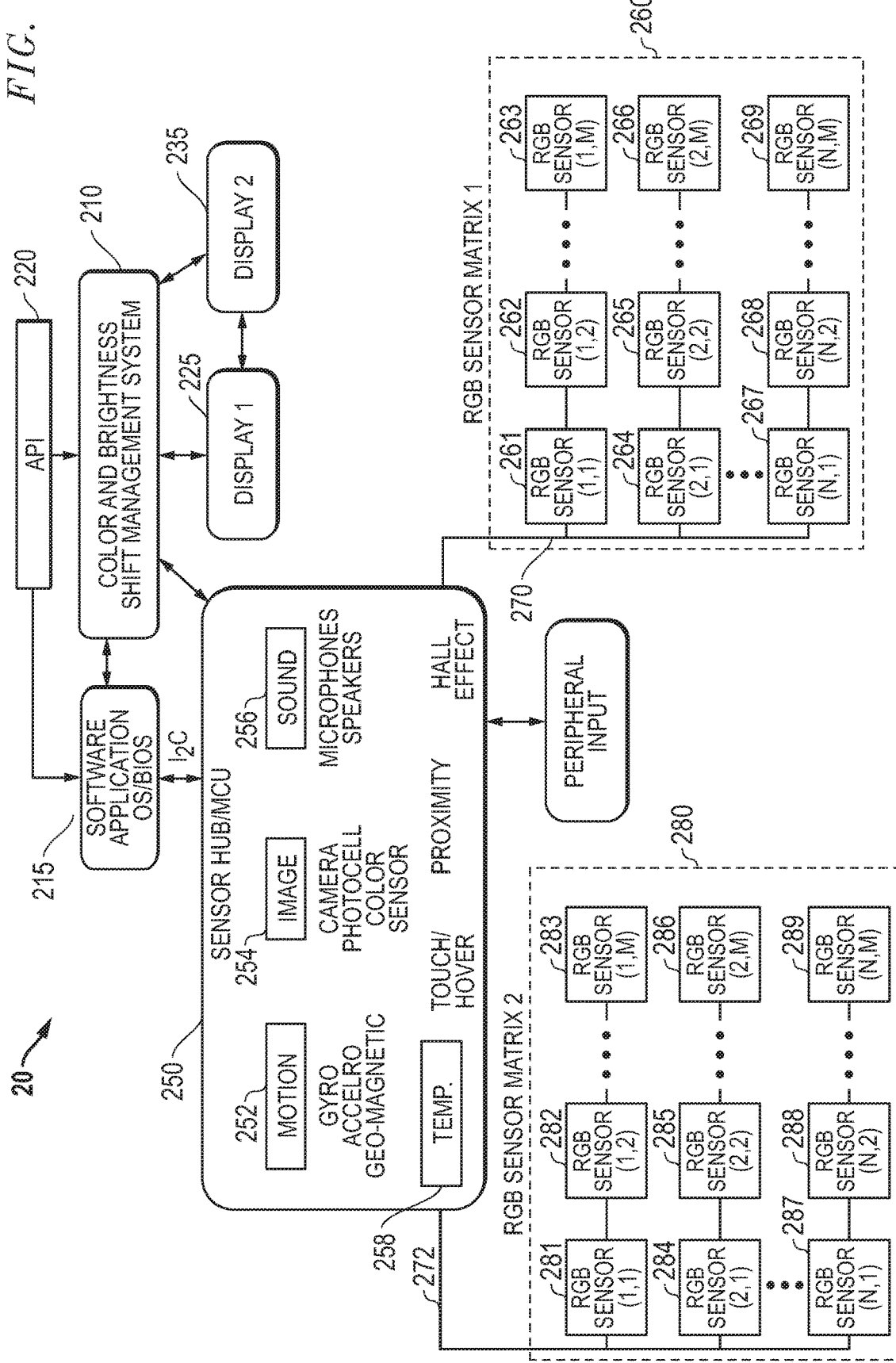
FIG. 2 illustrates a block diagram illustrating a sensors module and a dual display color shift management system for a dual display information handling system according to an embodiment of the present disclosure.

FIG. 2 illustrates system block diagram information handling system components 20 for implementing a dual display color shift management including sensor module 250 and context selection module (not shown) for monitoring active software applications in an information handling system. Also shown are the first display screen 225 and the second display screen 235 integrated into the dual display information handling system of the current embodiment. The dual display color shift management system 210 interfaces with a sensor hub or microcontroller unit 250 which may gather configuration data from various sensor for interpretation by a display mode selector as described above and determine configuration during operation of display 1 225 and display 2 235. Display 1 225 and display 2 235 may correlate to display screen sides 125 and 135 described above with respect to FIG. 1. Display 1 225 and display 2 235 may interface with dual display color shift management system 210 to provide data on operation time for color components of individual pixels or arrays of pixels, such as the time of operation for cathode/anode pairs activating organic emitter color components for OLED displays, with each of the displays 225 and 235 in some embodiments. In other embodiments, data may be collected on the overall operational time of each of display 1 225 and display 2 235 and provided to the dual display color shift management system 210 for some aspects of the currently disclosure. In yet other aspects of the embodiments herein, dual display color shift management system 210 may also interface with display 1 225 and display 2 235 via for providing adjusted color mapping via the graphics processing unit for adjusting brightness levels of color components of display 1 225 and display 2 235.

Adjustment of color brightness levels may come in the form of adjustments to color mapping data for one or both of display 1 225 and display 2 235 to adjust color expressions on those displays to be more uniform. The adjustments to color mapping data used by a GPU and graphics processing may adjust Vdd components for particular color components across the pixels of display 1 225 and display 2 235 during expression of certain colors in some embodiments. In other embodiments, individual pixels or subset pixel arrays may be adjusted by the color and brightness shift management system 210 by providing adapted color mapping data particular to pixels or pixel arrays for use by the GPU or GPUs to adjust colors expressed in display 1 225 and display 2 235 to be more uniform and accommodate undesirable effects of burn-in differences. Color mapping for pixel locations for a display may be adjusted and stored in memory associated with the graphics system and accessed by the GPU when preparing image data for display. Adjustment to color components may be made on a pixel by pixel basis in some embodiments, may be made over groups of pixels such as for pixel array locations, or may be made across an entire display screen side to adjust for color shifting during burn-in according to various embodiments of the present disclosure.

A GPU affiliated memory may include a selection of color tables or color maps which include display data (e.g., color data, brightness data) used by display pipe to provide data to one or more display panels that comprise display screen sides 225 and 235. In various embodiments, the color tables or color maps include information for each panel stored per pixel, per zone, or per region. In particular embodiments, several color tables may be available and recalibrated color tables may be added to the memory associated with a GPU which contain adjustments to a color gamut (e.g., with color offsets) for specific color shift adjustment conditions to be implemented in response to detected color shift changes occurring in one or more display panel regions during burn-in. The various color tables are indexed and selected for a particular operating conditions according to the type, amount, and location of color shift detected or estimated by the dual display color shift management system 210.

In one scenario, the red-green-blue (RGB) values of pixels are altered if sufficient threshold deviation from color brightness levels is expected or measured at relevant the location of the pixels. In a particular embodiment, a controller cross references burn-in usage time or "on" time with an expected burn-in brightness degradation model to determine how and to what degree affected pixels may have experienced brightness degradation. In other aspects, measurement of brightness levels may be conducted. In some embodiments, display data for pixels are altered using color and brightness offset registers with stored data tables (e.g., in lookup tables) corresponding to a range deviation that may occur due to varied burn-in levels.

Some disclosed embodiments employ data manipulation in which display data is altered through the use of algorithms to produce a re-mapping of data points on a color pallet. This achieves a desired color (e.g., consistent with other non-flexed regions) for a given set of display data for a region affected greater levels of burn-in usage in some embodiments. In some embodiments, these look up tables may be recalibrations of color tables stored in a graphics subsystem or other memory and include offset registers with offset values for certain color shift management measures. The offset registers may include, as examples, red offset, green offset, blue offset, and brightness offset for various levels of color shift adjustment. When certain burn-in conditions are detected, disclosed embodiments access the offset values for those conditions and cause the affected areas to display information with the color and brightness offsets taken into account. Accordingly, if a dual display color shift management system 210 detects above a threshold variation for a location or zone corresponding to one or more pixel array locations in the display screen sides, then color mapping data for these pixels is changed to result in the desired display output to be equalized between the pixel array locations. Pixels within each display screen side 225 and 235 makeup part of a pixel layer comprised of a plurality of color pixels. A GPU controls color characteristics (e.g., color intensity) by selectively altering one or more of the pixels within the pixel layer. This may be achieved, in some embodiments, according to specified red, green and blue gain settings. In addition or instead, a different color gamut in a color table is accessed which corresponds to the color shift management measures to be taken in an affected display screen side or region thereof.

The dual display color shift management system 210 may comprise a set of instructions of embedded controller 120 in the chipset(s) 108 or instructions run on CPU 105 or some combination. The dual display color shift management system 210, sensor hub 250, software applications and operating systems 215, and display mode selector interface with the application programming interface (API) 220 found in the information handling system software to coordinate various software applications and interface with any embedded controllers in some embodiments where the dual display color shift management system 210 is operating on a controller. The API may coordinate the dual display color shift management system 210, a display mode selector, sensor hub input data, other independent sensor input types peripheral inputs such as camera or touch hover detection applications that may operate through the sensor hub or by independent connectivity, display device drivers and RGB sensor systems and drivers for the same such as 260 and 280.

In other embodiments, a viewpoint detector (not shown) may be implemented to determine view location of a user as another sensor for configuration orientation purposes. This may correct for errors when a user's viewing position is not from a conventional position or orientation in perspective to a reference direction. In an embodiment, viewpoint detector emanates infrared light toward a user's eye and receives a reflection from the user's pupil to estimate the viewing angle of the display screen side or sides 225 and 235. In some embodiments, infrared light enters the eye and is reflected or re-emitted by the retina and detected by a receiver of the viewpoint detector. The reflected light makes the pupil appear "brighter" (in the invisible spectrum to humans) to the receiver. A controller in conjunction with viewpoint detector include software that acquire video information from the user's eyes, digitize the information, and estimate the location of the user's pupil based on the reflected light according to some embodiments.

As described, RGB sensors 260 and 280 may be one or a plurality of RGB sensors mounted on or in a display housing of each of display 1 225 and display 2 235 to detect one or more measurements of overall color brightness levels for the opposite display 1 225 and display 2 235 according to some embodiments. In some embodiments, RGB sensor matrices 260 and 280 may each include a matrix of M×N RGB sensors mounted in layer with display 1 225 and display 2 235 for detection of pixel cell matrix location specific RGB brightness of corresponding cell arrays in the opposite display screen or display screen portion. For example, RGB sensor matrix 260 may include a first row or column of RGB sensors 261 and 262 up to an Mth sensor 263 in an embodiment. Similarly, a second row of column of RGB sensors may include sensors 264 and 265 up to an Mth sensor 266. The number of rows or columns may include up to N columns including sensors 267 and 268 up to an Mth sensor in the Nth row or column at 269. Sensor matrix 1 260 may be connected to a sensor hub 250 via connection 270 or may be connected directly to an embedded controller operating the dual display color shift management system 210. In one example aspect, RGB sensor matrix 1 260 may be mounted behind an OLED display panel or panel portion such as display 1 225 and detect color brightness levels of display 2 235. For example, a test flash of display 2 235 may be detected by RGB sensor matrix 1 260.

RGB sensor matrix 280 may include a first row or column of RGB sensors 281 and 282 up to an Mth sensor 283 in another example embodiment. Similarly, a second row of column of RGB sensors may include sensors 284 and 285 up to an Mth sensor 286. The number of rows or columns may include up to N columns including sensors 287 and 288 up to an Mth sensor in the Nth row or column at 289. Sensor matrix 2 280 may be connected to a sensor hub 250 via connection 272 or may be connected directly to an embedded controller operating the dual display color shift management system 210. In one example aspect, RGB sensor matrix 2 280 may be mounted behind an OLED display panel or panel portion such as display 2 235 and detect color brightness levels of display 2 225. For example, a test flash of display 1 225 may be detected by RGB sensor matrix 1 280.

RGB sensors may include one or more solid state I2C interface-compatible solid state color sensors that may measure color temperature or color brightness of a given environment for red, green, and blue wavelengths of light and may be used to adjust white balance of displays 225 and 235 in an example embodiment. RGB sensors or RGB sensor matrix detectors may include components of an RGB filter, photodiode, and converter to convert detected light into components of red, green, and blue brightness levels which may then be converted into current levels in some embodiments. It is understood that charge-coupled device (CCD) sensors, CMOS or NMOS active pixel sensors, or other current or developing light and color sensor technologies may be used as RGB sensors. Measurement of white balance levels for red, green and blue components may be taken for opposing display screens 225 and 236 by one or more individual RGB sensors mounted in display housings opposite the display screen to be measured. Then measurements may be compared to each other or may be compared to data of an expected burn in color adjustment common for the type of display screens measured. In other embodiments, RGB sensor matrices 260 and 280 may be used take measurements across pixel array locations from opposite display screens 225 and 235 respectively. As described, RGB sensors in the RGB sensor matrices 260 and 280 may be aligned with corresponding display pixel array locations which may include one or more pixels at the array locations measured in some embodiments. In some embodiments, the RGB sensor detectors in the RGB sensor matrix may be in a mirror image orientation to the pixel array locations measure from the opposite display screen in the dual display screen information handling system.

The dual display color shift management system 210 and display mode selector receive data from the sensor system module 250 that includes an accumulator sensor hub that gathers sets of data from some or all of the orientation sensors shown. The orientation sensor types include motion sensors 252, image sensors 254, sound sensors 256, and other sensors 258. Some orientation sensors are connected through the sensor hub or accumulator device and system. Other orientation sensors may directly provide data to the dual screen dual display color shift management system via direct connections or their own application drivers. Orientation data is provided to determine usage configurations via a display mode selector in some embodiments which may be used to determine display screen usage amounts in some embodiments and for determination if there is a need for color shift management such as when a usage configuration orientation would display both display screen sides of a dual display information handling system to a user.

In an example embodiment, some image sensor data 254 may include separate image sensors used to detect orientation or may use the RGB sensors or sensor matrices 260 and 280. RGB sensor data from either image sensors 254 or RGB sensor matrices 260 and 280 may be connected through sensor hub 250 from sensor matrices 260 and 280 via connections 270 and 272 respectively. In other embodiments, the RGB sensors or sensor matrices may provide data directly to an embedded controller or other processor operating the dual display color shift management system 210 (not shown). RBG color brightness data is then provided to the dual display color shift management system 210 for determination of color shifts that may have occurred in some embodiments. In other embodiments, light sensor data may be used to assist in determination of orientations such as detecting a closed user configuration or detecting an orientation where one screen is oriented such that it has limited viewability (such as in a fully folded over or 360° tablet configuration or a movie configuration).

Motion sensors 252 may include one or more digital gyroscopes, accelerometers, and magnetometers which may further detect changes in usage configuration of the dual display screen information handling system. Motion sensors 252 may also include reference point sensors. For example, a geomagnetic field sensor may determine position of one or both display screens of the dual-screen information handling system and or the overall dual display information handling system device itself. This positional information may provide x-axis, y-axis, and z-axis positional information of the dual display information handling system relative to magnetic north pole, and there for a reference point of the device position. In one embodiment, two geomagnetic field sensors provide x-axis, y-axis, and z-axis positional information for each display screen of the dual display information handling system. With this data, the system determines the relative position of the two display screens to one another in orientation.

Also, a digital gyro and accelerometer may be used to detect motion and changes in position. These sensors may provide a matrix of data. In an example embodiment, the azimuth or yaw, pitch, and roll values of the device are indicated by the raw sensor data. The raw orientation data may be relevant to dual display color shift management system 210 as to an entire device in one embodiment or as to relative orientation of dual display screen sides for usage configuration in other embodiments. In an embodiment, determination of azimuth, pitch, and roll data may be made of individual display screens 225 and 235 for use with the dual display color shift management system 210. In a further embodiment, the two individual display screens are integrably hinged together along one side each display screen. Thus, relative positions of each individual display screen 225 and 235 are important input data to determining application of color shift management measures described in embodiments herein.

In connection with a reference point, such magnetic north as provided in one embodiment by a geomagnetic field sensor, the azimuth can be determined as a degree of rotation around a z-axis. Note this is different from hinge azimuth angle discussed further below. In an embodiment, the azimuth may be the value of the z-axis relative to the device y-axis as positive angle values between 0° and 360°. It is understood that a different range of values may be assigned in different embodiments.

Based on a reference point such as provided by a geomagnetic field sensor, pitch may be determined as a degree of rotation around the x axis. In an example embodiment, the angle values may range from positive 180° to negative 180° relative to the y-axis, although other value ranges may be assigned instead.

Roll is also based on the reference value, for example that established by a geomagnetic sensor. Roll may be considered to be rotation about the y-axis and its values may range from positive 90° to negative 90°. Again, the value ranges assigned can vary for each of the azimuth, pitch, and roll as long as a set of values is used to define orientation parameters in three-dimensional space.

The matrix of raw sensor data from the geomagnetic field sensor and the gyro and accelerometer sensors may be processed partly by a sensor hub or accumulator to provide orientation data for the dual display information handling system device. The sensor hub performs a fusion of data signals received from either a single sensor or multiple sensor devices. As described above in reference to FIG. 1, the sensor hub also processes raw sensor data to groom the raw sensor data into a useable form of positional analysis for the dual display information handling system and its display screens. In the example embodiment, the sensor hub is an independent microcontroller such as the STMicro Sensor Fusion MCU.

No more than three orientation sensors are needed in some embodiments. A reference sensor and a motion sensor associated is attached to one display screen to determine its orientation. A second sensor which is either another reference sensor or a motion sensor associated with or attached to the second screen to provide enough information of location or movement of the second display screen relative to the first display screen to determine the overall orientation mode of the dual display information handling system. Algorithmic calculation of the sensor data from the first display screen, such as a geomagnetic field reference sensor and an accelerometer motion sensor, may be used to determine the orientation of the first display screen according to a geomagnetic field or other reference point. Additional algorithmic calculations of movement data or differences in reference point data from the second display screen are used to determine position or orientation of the second display screen in space relative to the first display screen. The fixed location of the hinge and determination of the position of and relative angle between each of the two display screens also yields positional information on a hinge azimuth angle. The hinge azimuth angle, different from the raw azimuth z-axis measurement discussed above, relates to the orientation of the hinge axis relative to a user's viewing line or relative to the viewing line most likely to be used by a viewer based on the dual display device's current configuration.

In one example embodiment, two digital gyroscopes may be used, one for each display screen of the dual display information handling system, and a geomagnetic field reference sensor may be used in association with either display screen. In yet another example embodiment, two accelerometers may be used in addition to a reference sensor, one for each display screen of the dual display information handling system. Some sensor types may be combination sensor devices in certain embodiments as is known in the art. For example, a motion sensor may be used that combines the functions of a digital gyroscope and accelerometer to detect motion. Thus, one accelerometer and one digital gyroscope or two gyro-accelerometer combination devices may be used along with at least one reference sensor to determine the dual display information handling system orientation. Any combination of the above reference sensors and motion sensors may be used in a three sensor embodiment to determine orientation of the display screens (e.g. relative angle) and the hinge azimuth angle.

It is contemplated that more sensors associated with each of the first and second display screens provide more data permitting increased accuracy in determination the dual display information handling system orientation. This has trade-offs however in materials cost, space occupancy, and power consumption. Use of dual sensor types in each display screen for the dual display device permits two sets of processed orientation data to be developed by the accumulator. With these two sets of data, display mode selector of the central processor or the embedded controller may determine changes in movement of each display screen of the dual display device. These movement changes indicate relative position of these two display screen sides 225 and 235 to one another. This provides information permitting the system to understand the location and movement of each of the two display screens relative to one another as well as their position and movement in space overall. Such additional capability may provide more precise determination by the display mode selector of the usage configuration mode of the dual display information handling system during usage time measurements of each of the display screen sides 225 and 235 in some embodiments, for whether implementation of color shift management is warranted in other embodiments, or for detection of a closing configuration for activation of RGB sensors and test flashes from opposite display screen sides in yet other embodiments.

The relative measurements of position in space relative to a reference point may be further processed relative to measurements of position from other sensors. For example, azimuth, pitch, or roll may establish the position in space of one display screen. Then data from one or more sensors on a second display screen such as a gyroscope, may indicate a different azimuth, pitch, and roll for the second display screen. With position of the two display screens and a known hinge point (or points), the system determines a relative angle between the first display screen and a second display screen. Thus, an angle between the two display screen sides 225 and 235 may be determined for purposes of assessing usage configurations or for determining when a dual display screen information handling system has reached an almost-closed threshold angle to trigger measurement of display screen color brightness levels of each display screen side by the opposite RGB sensors or opposite RGB sensor matrices 260 and 280. Similarly, the system for determining orientation of the dual display device will have data on the location of a fixed hinge axis and based on positional information of the two display screens in space. Thus, the dual display color shift management system determines the hinge azimuth angle relative to the probable viewing line of a user. The viewing line of a user may also be detected with a camera detection system or other proximity sensor to recognize the location of a user relative to the dual display device for assisting in determination of the viewability of both display screen sides and thus a need for color shift management measure in some embodiments.

Other techniques are also contemplated to determine relative position and movement of two display screens integrated into a dual display information handling system. For example, Doppler Effect sound sensors 256 may typically include one or more microphones and speakers used in connection with Doppler effect calculations to determine relative position of two display screens in a dual display information handling system. A transmitter and microphone receiver can detect a Doppler shift in sound or ultrasound signal to measure distance or location of the two display screens integrably hinged. In one example, the Doppler Effect sensors may operate in the 0-40 kHz range to detect relative location of the hinged dual screens in an open configuration.

Image sensors 254 may include a camera, photocell, or color sensors as described. A photocell may detect the open or closed state of a dual display information handling system by determining hinged screens are no longer in a closed position when light is detected by the photocell. Additionally, the photocell may detect ambient light levels in determining brightness levels of one or more display screens. Ambient light levels may also be used in determination of whether color shift adjustment measures are warranted in the current ambient lighting conditions in some embodiments such as whether a difference would be noticeable to a user between display screen sides under current lighting conditions. In other aspects, an ambient light sensor may be used to determine sensitivity tuning of color shift adjustment measures as described in embodiments herein. A photocell may even be used to indicate when one display screen is oriented face down on a surface such as a table while the other display screen may be actively displaying in an example embodiment.

A camera may be used as an image sensor to provide several types of feedback. It may be used as a light sensor similar to a photocell. A camera sensor may also serve as an RGB sensor in some embodiments. A camera may also be used to facilitate a reference point for orientation by detecting the presence and location of a user in front of one or more display screen of a dual display information handling system. Location of a user relative to one or both display screens provide a rough user viewing vector that may be used to determine usage configuration mode of the current detected orientation by the display mode selector. The camera may be tasked to sense the position of a user around the two screens (for example, directly in front, above, below, to the right, or to the left of the plane of the display screen) as well as using facial recognition capability as is known to the art to determine the orientation of the person's face. This information enables the system to correctly orient both displays on the display screens according to a viewing line of sight (or viewing vector) based on position and orientation of the user. The displays on each display screen may be oriented in landscape or portrait as well as determining which side should be the top of the display for each screen relative to the viewer.

In addition to motion sensors 252, image sensors 254, and sound sensors 256, other sensors 258 such as a variety of state of usage activity sensors are contemplated. For example, touch or hover sensors may detect which screen is actively being used. Proximity sensors may detect the location of a user relative to one or both display screens. Proximity sensors in one or both display screens may detect the position of a user around the two screens (for example, directly in front, above, below, to the right, or to the left of the plane of the display screen) and thus infer the viewing vector based on the position of the user or users. Similar to the camera, this proximity sensor information enables the system to correctly orient both displays on the display screens according to a viewing line of sight (or viewing vector) based on position and orientation of the user. The displays on each display screen may be oriented in landscape or portrait as well as determining which side should be the top of the display for each screen relative to the viewer. As described further below, a tilt of one or both display screens may also orient the display on the display screen via a gyroscope or accelerometer sensor providing this state of usage activity information.

Another state of usage activity sensor is a Hall Effect sensor that may detect when a magnet, of certain polarity and strength, is in proximity to the sensor. It is used to detect the closed position of a device with two sides. For example, a Hall Effect sensor may determine when two integrably hinged display screens are closed onto one another so that a magnet in one screen triggers a Hall Effect sensor in the second screen. Alternatively, a different Hall Effect sensor may determine if the hinged display screens are open to an orientation of 360° so that the back sides of the display screens are in proximity such that a magnet located with one display screen triggers the Hall Effect sensor of the other.

Hall Effect magnets and magnetic sensors may be deployed as a type of motion sensor 252 although it is also a position or state sensor. It is known in the art that a relative angle between a magnetic field source of known polarity and strength may be determined by strength and change to a magnetization vector detected by magneto-resistive detectors of a Hall Effect sensor. Thus, motion and relative angle may also be detected by the Hall Effect sensors. Other detectors are also contemplated such as a hinge angle detector that may be mechanical, electromechanical or another detecting method to determine how far the hinge between the two display screens has been opened. Such detectors are known in the art.

A context selection module may operate with the software applications operating on an operating system (OS) 215 and may operate in BIOS to determine what software applications have been operating on the dual display information handling system. Categories of software application contexts that have operated using the display screen sides 225 and 235 may be determined based on graphics usage intensity levels as well as whether such applications would be viewed and operate on both display screen sides 225 and 235 simultaneously. Such information may be provided to the dual display color shift management system 210 to assist in determining whether one display screen side is utilized more intensively with respect to color brightness than the other display over time such as during a burn-in period in some aspects. In other aspects, the application context selection module data may be used to assess whether portions of one or both display screen sides may have excessive use of color brightness at hot spots on those display screens during a burn-in period such that portions of either display screens 225 or 235 may experience greater burn-in due to color brightness at those locations.

For example, running certain software applications, such as running office applications for database creation, word processing, note applications or the like, which in some cases may utilize one display screen side for a virtual keyboard while the other display screen side may provide graphics of content. In such a case, color brightness utilization may be uneven as between display screen sides. Further, some software applications may have consistent high-use regions during operation for color brightness such as center portions of screens for video playback or gaming applications or task bars, pin bars or control panels located along top, bottom, or side edges of display screen sides in other cases. As such, inconsistent color brightness usage levels may occur across individual display screen sides as well as between display screen sides. In other aspects, some software applications may involve high intensity graphics usage while other software applications may have lower intensity graphics usage which may be tracked by the dual display color shift management system 210 which may alter the expected duration of burn-in to either a faster or slower rate for either or both display screen sides of the dual display information handling system. In some embodiments, this data may be used to amend the expected color shift that may be experienced.

The context selection module that may operate to detect the working software applications operating on an operating system (OS) 215 via BIOS. Software context selection module may also determine what software applications are currently operating on the dual display information handling system to assist the dual display color shift management system in determining when color adjustments are warranted. Categories of working software application contexts may be determined based on graphics usage intensity levels as well as whether such applications would be viewed and operate on both display screen sides 225 and 235 simultaneously. Some categories of working software applications may require color shift management due to the need for optimal graphics color representation for the graphic being utilized across one or both display screen sides 225 and 235. In other aspects, high intensity graphics classification may be applied to applications which integrably utilize both display screen sides 225 and 235 at the same time such that the likelihood of side-by-side viewability of both display screen sides is higher, and differences in the imagery viewed is at high risk of being noticeable. The categories of working software applications requiring color shift management measures to be applied may include, in some example embodiments, a list or customizable list of software applications where color shift management measures may need to be applied in some embodiments.

For example, high intensity graphics classification may be applied when high graphics quality may be required for some applications such as gaming, video playback entertainment, accessing some internet data applications, or even video communications in some aspects. Other applications may garner high intensity graphics classification such as book reader applications, some internet websurfing applications, photo or video playback entertainment, or the like where side-by-side viewing of comparable imagery on both display screen sides may occur. Other applications such as single display screen video and voice communications, internet data applications, email and other electronic communication, single screen websurfing, music, mobile applications, and others may not garner a high intensity graphics classification. Such decision to designate applications may be pre-selected, such as for dual screen reader applications, or may be customizable by a user or administrator according to similarities in display screen side content display on a dual screen information handling system. Some applications may have high-intensity graphics classification when utilized across both display screen sides 225 and 235 although it may not be the case that both display screen sides are always comparable. For example, websurfing or use of some types of mobile applications may have similar usage on both sides of a dual screen device such that a risk of comparable graphics viewing between both display screen sides 225 and 235 by a user may occur in some instances but not in other usage configuration orientations or operations.

As described above with respect to assessing software application operation may also determine if both display screen sides are utilized equally, for example, running certain software applications such as office applications for database creation, word processing, note applications or the like where one display screen side for a virtual keyboard while the other display screen side may provide graphics of content may not require color shift management since both sides are not necessarily comparable when viewed by a user. In such a case, color brightness differences, though uneven between display screen sides, would be less noticeable.

Finally, some software applications with identifiable, consistent high-use regions of color brightness such as center portions of screens for video playback or gaming applications or that have task bars or pin bars for located along top, bottom, or side edges of display screen sides in other cases may have high intensity graphics classification. As such, inconsistent color brightness usage levels may be adjusted for across individual display screen sides as well as between display screen sides. In this way, software application contextual assessment may determine high intensity graphics usage or classification by cross-referencing an applications list and may indicate to the dual display color shift management system 210 when implementation of color shift management is required to counter adverse effects of uneven burn-in between dual display screen sides or across individual display screens.

Figure 3:
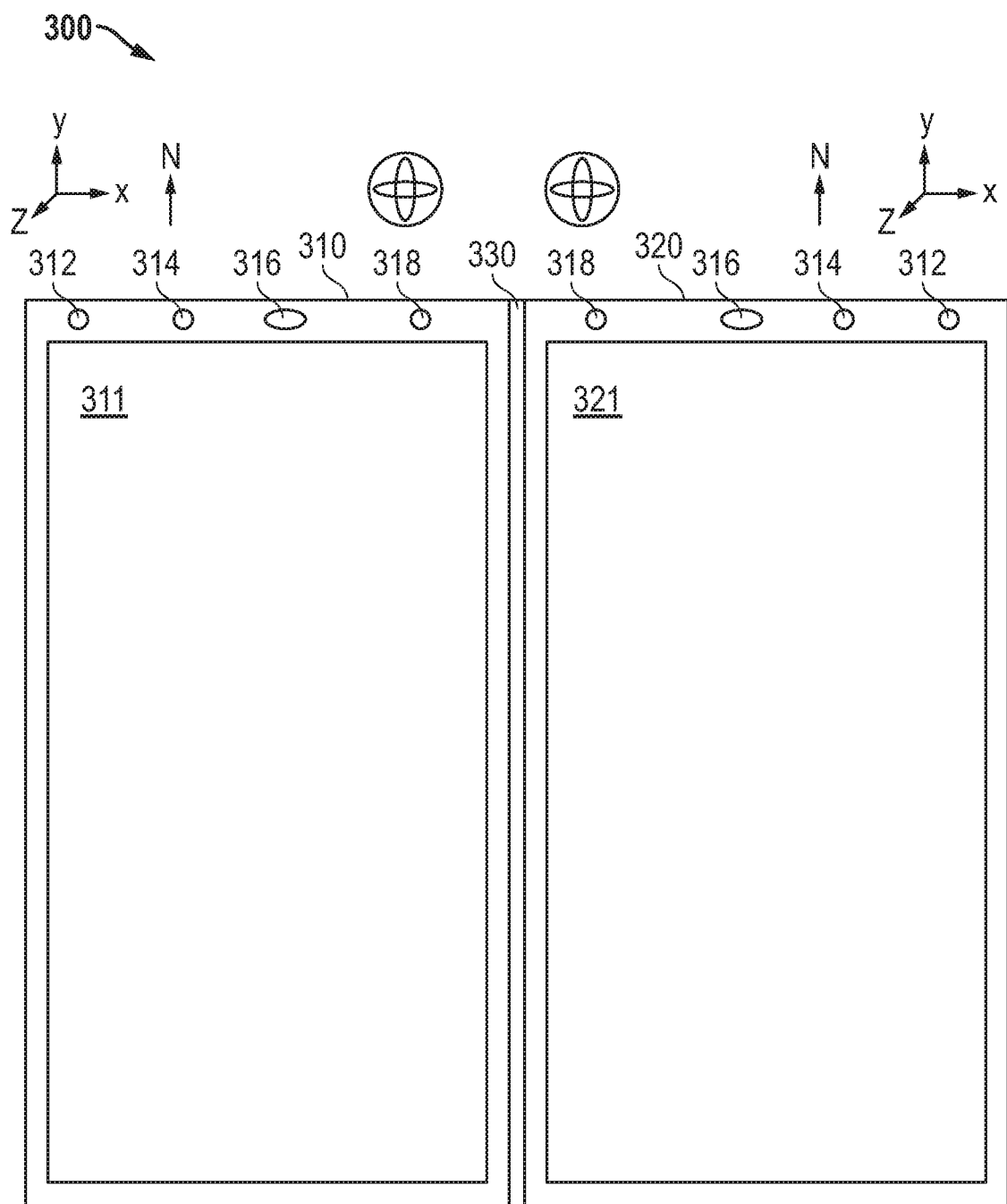
FIG. 3 illustrates an example dual display information handling system having a display screen including first and second display panels according to an embodiment of the present disclosure.

FIG. 3 shows an example of a dual display information handling system with two hinged display screens according to an embodiment of the invention. The dual display information handling system 300 has a first display screen 311 in display screen side or housing 310 and a second display screen 321 in display screen side or housing 320 in the disclosed embodiment. As illustrated in this embodiment, the dual display information handling system is in a portrait double tablet orientation with both the first display screen 311 and the second display screen 321 viewable. Further, first display screen 311 and the second display screen 321 may be viewable side by side by a user such that noticeable uneven color shifts are a risk. It is understood that first display screen 311 and the second display screen 321 may be display screen sides of a single, flexible display screen which may flex as housings 310 and 320 are reconfigured about hinge 330. In other embodiments, two separate display screen panels may be used as first display screen 311 and the second display screen 321. First display screen 311 and second display screen 321, or their housings 310 and 320, are connected via a hinge structure 330 along one side of each display screen. Hinge structure 330 may be oriented at any of multiple points or along the entire length of one side of each of the first display screen 311 or housing 310 and second display screen 321 or housing 320. Alternatively, one or more hinge structures 330 may be connected only at portions of the edges of the two display screens 311 and 321 or their respective housings 310 and 320. For example, one hinge point connection may be sufficient at only one spot along the edge of the two display screens. In another embodiment, two connection points may be sufficient. In this example the two connection points may be near the ends of the hinged edges of the two display screens 311 and 321 in an example embodiment. The hinge connection 330 may include power and communication connections allowing information and power to be transferred between display screens 311 and 321 and their respective housings 310 and 320 as well as opposite housings. This will provide flexibility on where to locate various processors, power sources, connections, and sensors as between the housings 310 and 320 of display screens 311 and 321. In another embodiment, one or more display screens 311 and 321 may not require any housing and most or all components may be stored in the hinge connection 330 or the housing of the other display screen.

In yet another embodiment, the hinge connection 330 may be disconnectable to permit display screens 311 and 321 to operate as display screens connected by a wireless connection or as altogether independent information handling systems such as tablets. Magnetic connectivity may maintain the hinge structure 330 when a disconnectable hinge is connected. Wireless data connection between detachable display screens 311 and 321 may be made via wireless communication standards such as near field communication (NFC) per standards ISO 18000-3, ISO 13157 and related standards or low power Bluetooth based connections (e.g. IEEE 802.15.1) maintained between the detachable display screens. Separate power sources, such as batteries, may need to be provided for each of the display screens, however coordination of power savings strategies may still be utilized to preserve battery power on one or both devices in accordance with the disclosures herein.

FIG. 3 also illustrates various sensor components in a dual display information handling system embodiment according to the disclosures. FIG. 3 illustrates a double tablet orientation mode 300 for the dual display information handling system according to an embodiment of the present disclosure. In this orientation, a first display screen 311 and a second display screen 321 are connected via a hinge 330. Any hinge azimuth orientation relative to the sight line of a viewer may be included as a double tablet orientation 300. In this embodiment, the hinge 330 is designed so that the dual display information handling system may be arranged in an open position at approximately 180° where the front of both display screens 311 and 321 are viewable. Display screens 311 and 321 may be combined virtually into a single viewable screen so images are viewable across both display screens for certain software applications. A range of dual tablet relative hinge angle between the two display screens is contemplated. Generally, if both display screens are viewable and combined as a single viewable screen within a defined angle range about 180°, the system orientation may be considered double tablet mode. In one example embodiment, it is contemplated that a double tablet orientation with viewability, have a relative hinge angle of between approximately 160° and approximately 200°.

One or both display screens or their respective housings may contain one or more accelerometers 312, geomagnetic sensors 314, RGB sensors or cameras 316, or digital gyroscopes 318. Additional state sensors may also be present including a photocell ambient light sensor, a Hall Effect magnet and sensor, camera, touch/hover sensors, and other sensors as described above. In one example embodiment, one or more RGB sensors or cameras 316 may mounted on a display screen side housing 310 to capture display color brightness data of display screen 321 pursuant to a test flash in a near closed position according to some embodiments. Similarly, one or more other RGB sensors or cameras 316 may mounted on a display screen side housing 320 to capture display color brightness data of display screen 311 pursuant to a test flash in a near closed position according to other embodiments. In yet other aspects, an RGB sensor matrix of photodiode detectors or other RGB sensor types may be mounted with, such as behind, each display screen 311 and 321 to capture pixel array location specified color brightness data from the opposite display screen pursuant to a test flash according to embodiments described herein.

There is no requirement that all sensor types be present. For example, a sensor module may only need a motion detector and a reference sensor as described above for one display screen and another sensor in a second display screen. For example, either an accelerometer 312 or a gyroscope 318 and a reference sensor such as a geomagnetic sensor 314 may be associated with one display screen 311 while the other display screen 321 has a sensor to detect changes or differences between the two screens 311 and 321. The second screen may use a second geomagnetic sensor 314, or one motion sensor 312 or 318. There are even techniques known in the art of using a Hall Effect sensor or a Doppler shift sensor in the second display screen 321 to indicate changes in position as described above. The more sensor data available in each display screen 311 and 321 of the dual display information handling system, the better accuracy of the orientation data and less computing required to determine the positioning orientation. The down side however is added the expense, space, and power resources that many sensors will occupy in the dual display information handling system.

FIGS. 4-8 illustrate a plurality of additional exemplary embodiments of usage configuration orientation modes for a dual display information handling system with two display screen sides integrably hinged along one side. Some embodiments depict two separate display screen panels on the display screen sides while other embodiments depict a single flexible display screen that may be mounted across two display screen sides however it will be understood that either embodiment may be utilized with any of the display orientation usage configurations shown in these figures as well as that of FIG. 3. The display orientation modes reflect the orientation of the dual display information handling system in three-dimensional space and the relative positions of the display screens to one another. Add to the display orientation such factors as the working software application context and the state of usage activity of one or both of the display screen sides due to orientation, and the dual display color shift management system determines a color brightness usage levels across display screen sides for the dual display device in some embodiments. In other embodiments, the dual display color shift management system may determine if color shift management is needed during operation. In some example embodiments, working software application context or state of graphics usage activity due to orientation may have little or no input on determining the color shift management needs. In other cases, such data may be determinative of activation of color shift management measures to balance color shift differences between display screen sides.

In one embodiment, two display screens are connected by a 360° hinge along one side with data and power connections so that communications and power may be shared between each side having a display screen. In one particular embodiment, the 360° hinge also allows any orientation between the two hinged display screens at any relative angle in from 0° in a fully closed position to 360° where the dual display screens are open fully so that the opposite sides of the display screens contact one another. Several of example display orientation modes are illustrated in FIGS. 4-8, but it is understood that others display mode orientations are contemplated as well for utilization of a dual display screen information handling system of the present disclosure.

Figure 4:
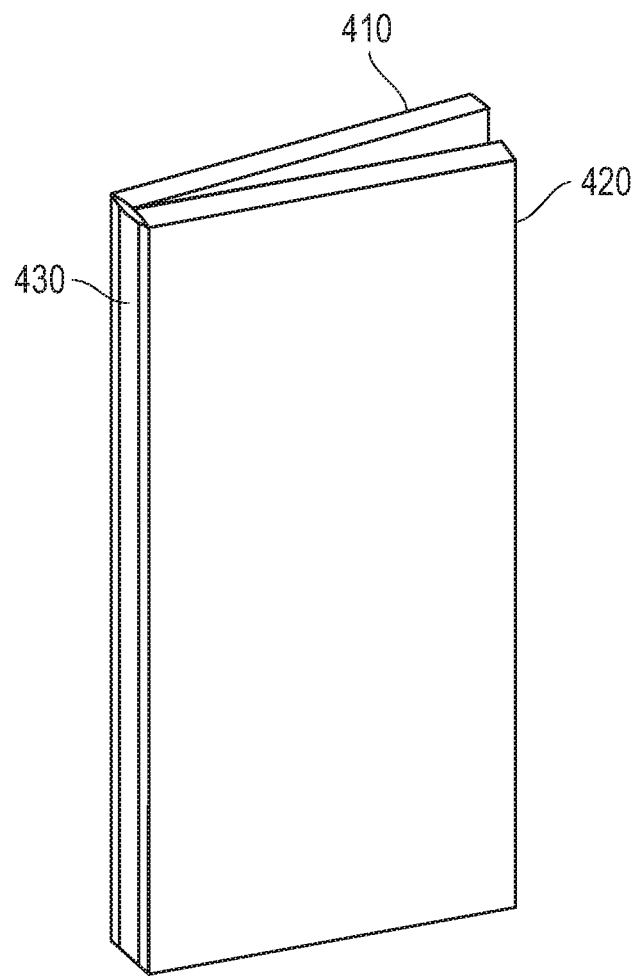
FIG. 4 illustrates an example dual display information handling system in an almost-closed orientation according to an embodiment of the present disclosure.

FIG. 4 shows an example of a dual display information handling system with two hinged display screens according to an embodiment of the invention. The dual display information handling system 400 has a first display screen housing 410 and a second display screen housing 420. As illustrated in this embodiment, the dual display information handling system is in an almost closed orientation with both the first display screen surface and the second display screen surface approaching contact with one another and just before the display screens are closed internally to one another. The display screen sides in first display screen housing 410 and second display screen housing 420 are nearly facing one another. First display screen housing 410 and second display screen housing 420 are connected via a hinge structure 430 along one side of each screen. In the shown embodiment, hinge structure 430 may run most of the entire length of the display screen housings 410 and 420. In other embodiments, one or more hinge points 430 may be mounted along a hinge edge of each of 410 and 420. The almost-closed configuration mode or orientation may require a threshold angle between first display screen housing 410 and second display screen housing 420 above a 0° angle and a threshold angle. The 0° angle may represent a fully closed orientation. The threshold angle of an almost closed configuration may be an angle such that display screen sides in first display screen housing 410 and second display screen housing 420 are sufficiently facing one another to allow for a test flash of each display screen to successfully have color temperatures measured by at least one RGB sensor or an RGB sensor matrix in the opposite display screen housing respectively. In some particular embodiments, the test flash and RGB sensor measurements may be conducted during initial opening from a closed position in some embodiments or as reconfiguration approaches a closed position in other embodiments and reaches the threshold angle. In example embodiments, an angle of 10° may be used as a threshold angle for an almost-closed orientation. In other embodiments, a 5° angle may be used as a threshold angle. In yet other embodiments any threshold angle may be used to initiate the test flash and RGB measurements so long as sufficient measurements of the opposite display screen are possible for the embodiment utilizing RGB measurements of color shift variations. Some measurement accommodation adjustment may be made during measurements of portions between the test flash and RGB measurement sides to account for distances between the two display screen sides during measurements. For example, along the hinge edges of the display screen sides may be closer to one another than along leading edges of the display screen sides. The test flash may be adjusted to increase with further distance or the RGB sensor brightness measurements may have a built-in adjustment to accommodate for the differences.

Figure 5:
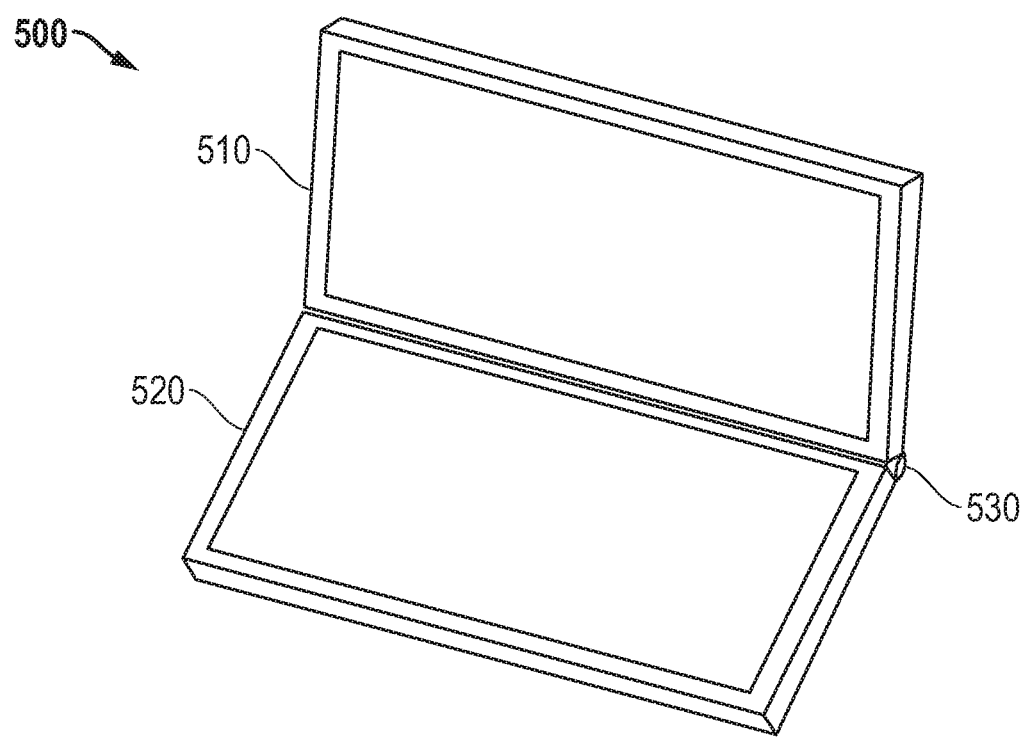
FIG. 5 illustrates an example dual display information handling system in laptop mode orientation according to an embodiment of the present disclosure.

FIG. 5 illustrates a laptop orientation 500 as a usage configuration for the dual display information handling system embodiment of the present disclosure. In the embodiment of FIG. 5, a first display screen housing 510 and a second display screen housing 520 are connected via a hinge 530 having a hinge azimuth orientation at 0° or perpendicular to the sight line of a viewer. The hinge is designed so that the dual display information handling system may be arranged in an open position at approximately 100° relative angle between the two display screens and where the front of both display screens are viewable. The hinge 530 may be one or more connection points along hinge edges of 510 and 520 or run along those edges. A range of laptop orientation relative hinge angles between the two display screens is contemplated, so long as the lower or base display screen 520 is usable for an application interface such as a virtual keyboard. In one example embodiment, it is contemplated that laptop orientation have a relative hinge angle of between approximately 90° and approximately 120°. In the example embodiment of the laptop orientation 500, the usage of the dual display information handling system may include substantially different display content as between the first display screen side of 510 and the second display screen side of 520. Determination of how the detected usage configuration in a laptop orientation 500 impact the color shift management may depend in part on the software application contextual information provided in some embodiments. For example, if laptop orientation 500 is detected and a software application is operating that invokes a virtual keyboard or other virtual tool input system such as a virtual desktop interface on display screen side 520, this may impact both color brightness usage levels between display screen sides in one aspect, and this may impact the estimated color brightness usage levels or measured color brightness usage levels for whether color shift management measures are necessary in other aspects of various embodiments herein. In other embodiments, the laptop orientation 500 of the dual display information handling system may, by itself, impact whether or how sensitive color shift management measures are implemented since the likelihood of both display screen sides displaying contiguous content may be lower in such a usage configuration. Laptop orientation 500 along with software context data may also be used to determine that the display screen sides of 510 and 520 will display different content.

Figure 6:
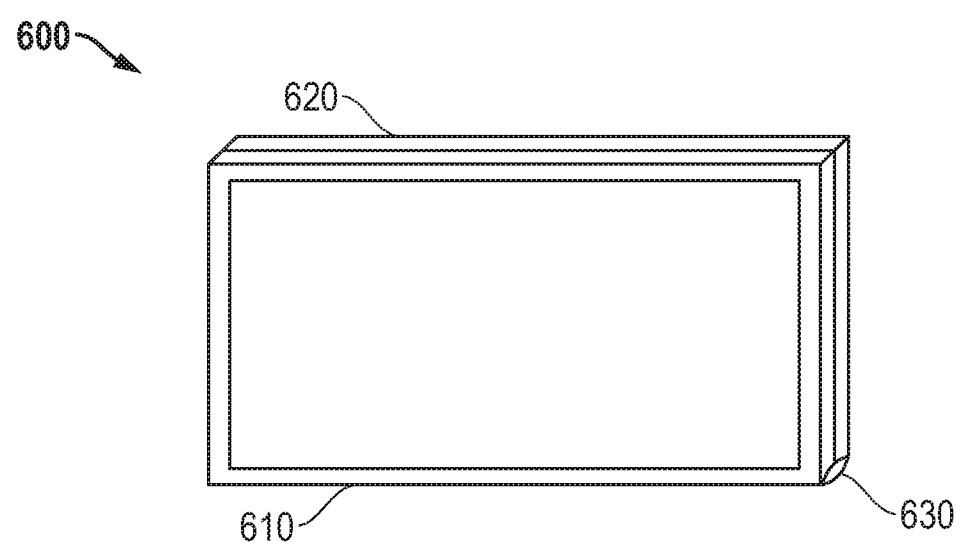
FIG. 6 illustrates an example dual display information handling system in tablet mode orientation according to an embodiment of the present disclosure.

FIG. 6 illustrates a tablet orientation 600 for the dual display information handling system embodiment of the present disclosure. In the embodiment of FIG. 6, a first display screen housing 610 and a second display screen housing 620 are connected via hinge 630 where the hinge 630 is fully open so that the back sides of the two display screens 610 and 620 are in contact or nearly in contact on the back sides of the respective display screen housing. In tablet orientation mode 600, first display screen side of 610 is viewable while the second display screen side of 620 is folded behind. Orientation of the device is shown in landscape with a bottom hinge location in the shown embodiment, but it is understood that a top hinge orientation as well as a left or right hinge portrait orientation or any angle of tablet orientation may be used in various embodiments. In one example embodiment, it is contemplated that tablet mode orientation have a relative hinge angle of between approximately 340° and approximately 360°. If a detected usage configuration by the display mode selector from sensor hub/MCU data is the tablet orientation 600, this may also impact the color shift management system of the present embodiments. In one aspect, operation in tablet orientation 600 may impact color brightness usage time attributed between the two display screen sides of 610 and 620 during monitoring by the dual display color shift management system of the present disclosure in some embodiments. In other embodiments, the tablet orientation 600 will have a low risk of a user viewing both display screen sides of 610 and 620 simultaneously and may not require color shift adjustment measures as between the two display screen sides. In such an embodiment, the color shift management system may not implement color shift measures when the tablet orientation 600 is detected. In yet other embodiments, color shift measures may only be implemented within the active display screen side, either 610 or 620, that is detected as being actively viewed or used by a user.

Figure 7:
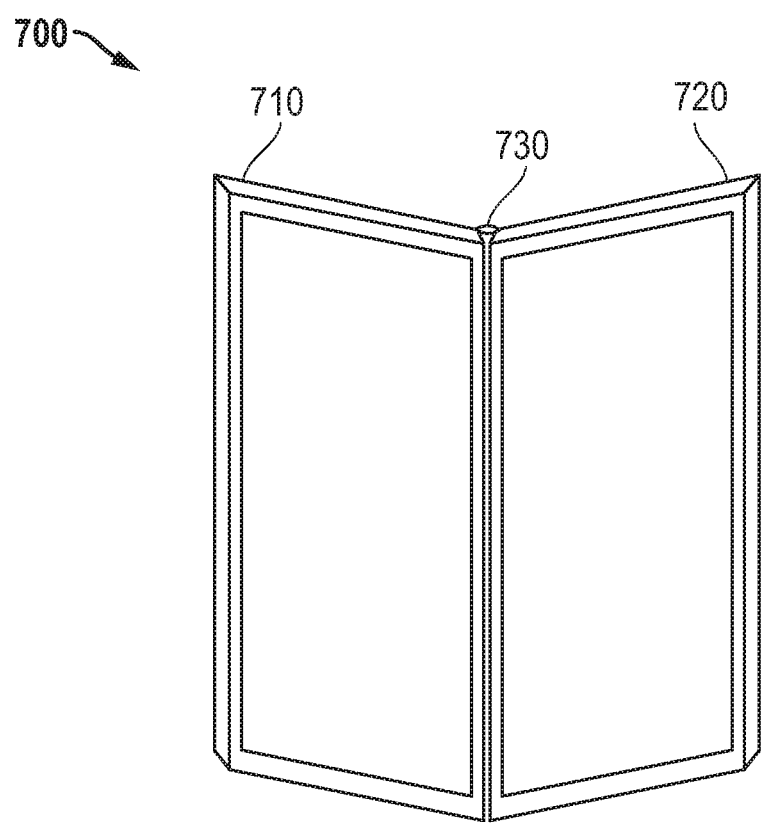
FIG. 7 illustrates an example dual display information handling system in book mode orientation according to an embodiment of the present disclosure.

FIG. 7 illustrates a book mode orientation 700 for the dual display information handling system embodiment of the present disclosure. In the embodiment of FIG. 7, a first display screen 710 and a second display screen 720 are connected via a hinge 730 having a hinge azimuth orientation at approximately 0° or parallel to the sight line of a viewer. The hinge is designed so that the dual display information handling system may be arranged in an open position at approximately 90° relative angle between the two display screens and where the front of both display screens are viewable. A range of book mode orientation hinge angles, or the relative hinge angle between the two display screens, is contemplated with both display screens to be viewed with images in portrait orientation. In one example embodiment, it is contemplated that book mode orientation have a relative hinge angle of between approximately 20° and approximately 180°. Note that this angle range may overlap somewhat with embodiment of other orientations including a double tablet orientation mode as shown in FIG. 5 for example.

If a display mode selector determines a book mode orientation 700 from sensor hub and other orientation data inputs, this too will affect the implementation of the dual display color shift management system in some embodiments. In one aspect, operation in book mode orientation 700 may impact color brightness usage time attributed between the two display screen sides of 710 and 720 during monitoring by the color shift management system of the present disclosure in some embodiments. In other embodiments, the book mode orientation 700 will have a substantially higher risk of being viewed simultaneously on both display screen sides of 710 and 720 and may not require color shift adjustment measures as between the two display screen sides. In such an embodiment, the color shift management system may always implement color shift measures when the book mode orientation 700 is detected. In other embodiments, sensitivity of the dual display color shift management system may be increased to ensure side-by-side similarities across display screen sides of 710 and 720 since continuity of content has a higher likelihood between the display screen sides. As with other embodiments, operating software application context with respect to graphics intensity categorizations or determination of continuity of content across the display screen sides may also play a part in determining sensitivity levels, or if and what sort of color shift management measures may be taken.

Figure 8:
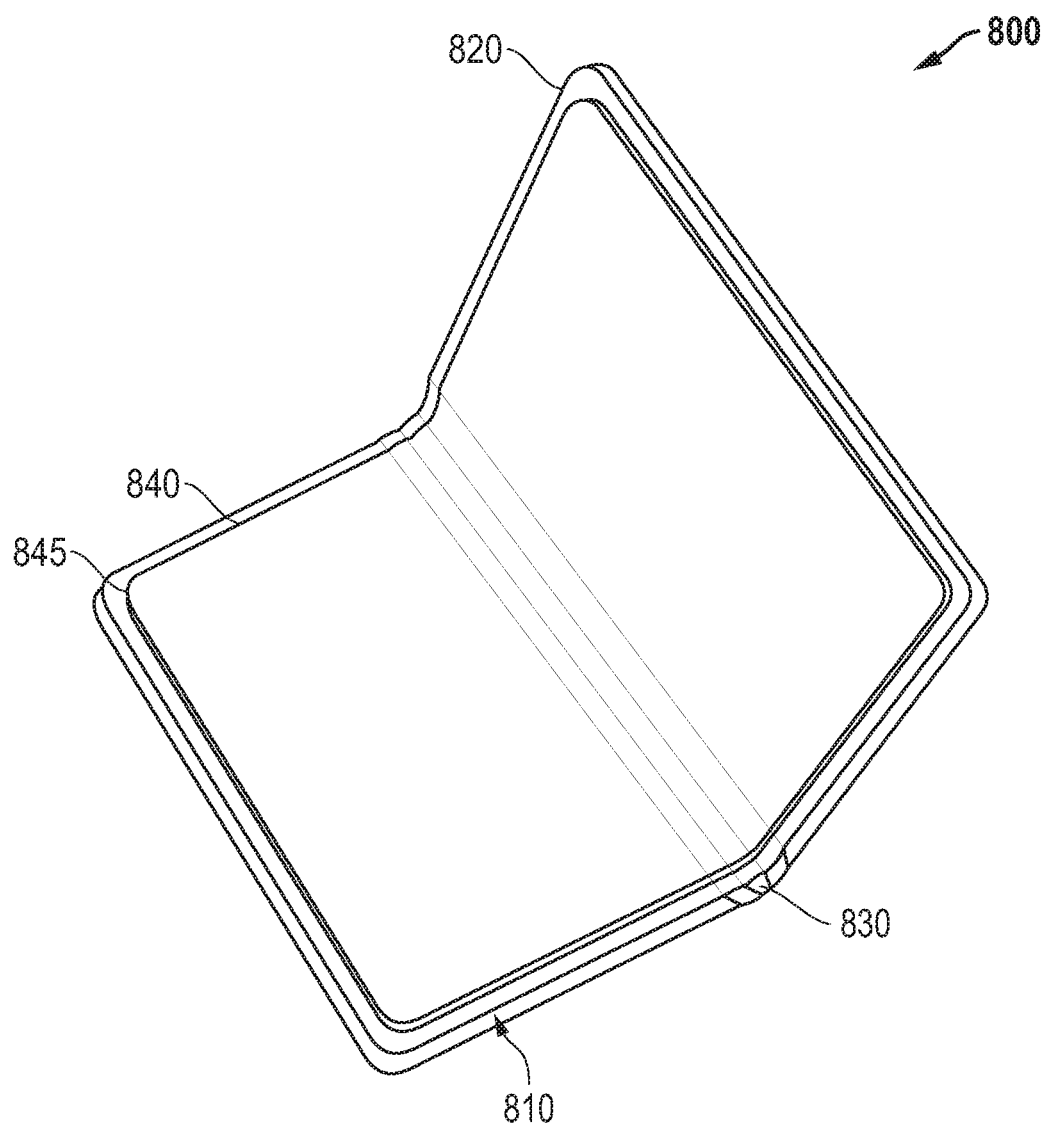
FIG. 8 illustrates an example dual display information handling system with flexible display screen having a first and second portion across two display housings according to an embodiment of the present disclosure.

FIG. 8 illustrates a laptop mode orientation 800 where a single flexible display screen 840 may be supported by two display screen sides 810 and 820 along a hinged area 830. The two display screen sides may be implemented with two display screen portions of display screen panel 840 supported respectively by a first display screen side 810 and a second display screen side 820. The display portions on the first display screen side 810 and second display screen side 820 may experience different display burn-in characteristics depending on color brightness usage time and may be subject to color shift management measures by the dual display screen color shift management system embodiments as described herein. Color shift management measures may be implemented while measuring and accounting for applications operating on one or both display screen sides differently in some aspects as well as detected orientations during operation causing differences between color brightness usage or impacting simultaneous viewability of both portions of display screen 840. In a further aspect, the dual color shift management system may account for estimated color shift changes both between display screen sides of 810 and 820 as well as across each display screen side when burn-in may be non-uniform on each display screen side due to hot spots of color brightness usage as described in example embodiments herein. Considerations for the dual display screen information handling system in laptop orientation 800 may be similar to those described for FIG. 5 with respect to implementation of the dual display color shift management system of embodiments in the present disclosure.

In another aspect, one or more RGB sensors or sensor matrices 845 may be mounted behind the flexible display screen 840 to measure color brightness changes as between two display screen portions of the two display screen sides of 810 and 820 in accordance with embodiments herein. With a flexible display screen 840 however, the almost closed position may be more difficult to reach such that display screen portions on the two display screen sides 810 and 820 face each other in some embodiments. In other embodiments, flexible display screen 840 may crease or otherwise fully close however. Further, since the "closed" position of FIG. 4 may be less frequently used with a flexible display screen 840, a user may be prompted at time to "close" or orient the display screen sides of 810 and 820 such that the respective display screen portions may activate RGB sensor measurements and test flashes in embodiments where measurement may be utilized by the dual display screen color shift management system. In some dual display information handling systems with a flexible display screen 840, a tablet orientation such that the flexible display screen 840 is on the outside of the dual display information handling system about a 360° angle of the display screen housings 810 and 820 is the actual off position. Thus, an almost-closed orientation may need to be actively induced by a user to conduct color brightness measurement tests. In other embodiments, closed configuration of an embodiment in FIG. 8 may be oriented similar to the dual display information handling system of embodiments implementing two display screen panels when flexible display screen 840 has an ability to be creased or is a flat-foldable flexible display screen in other embodiments. It is understood, that many of the usage mode orientations described herein may have similar considerations for a dual display screen information handling system having a single flexible display screen panel 840 supported by two display screen sides 810 and 820 as described herein for the several usage mode embodiments such as for FIGS. 3-7. Accordingly, it is understood that operation of the dual display color shift management system of embodiments herein may be applied to flexible display screen systems with two configurable display housing portions 810 and 820 as well.

Other orientations are contemplated as well for a dual display information handling system which may implement color shift management for the display screen sides. For example, a media display or movie mode orientation for the dual display information handling system may be one embodiment of the present disclosure. In such an embodiment, display screen sides a first display housing and a second display housing are connected via a hinge having a hinge azimuth orientation at approximately 90° or a hinge line perpendicular to the sight line of a viewer. The hinge is designed so that the dual display information handling system may be arranged in an open position at approximately 305° relative angle between the two display screens and where the front of one display screen is viewable and the other display screen is face-down. However, a range of relative hinge angles between the two display screen sides would also be contemplated. In one example embodiment, it is contemplated that media display mode orientation have a relative hinge angle of between approximately 250° and approximately 340°. Note that this may overlap somewhat with other orientation modes. The media display mode or movie mode orientation includes one display screen generally facing in a downward orientation and unlikely to be viewable simultaneously with the other display screen side. With the media display mode orientation, continuity of content simultaneously viewable on both display screen sides is unlikely when one display screen side is oriented downward such as on a table top or lap. Accordingly, this will impact color brightness usage time between the display screens as well as influence on whether or what type of color shift management measures are implemented.

Another example embodiment includes a tent mode orientation for the dual display information handling system embodiment of the present disclosure. In such an embodiment, a first display screen and a second display screen are connected via a hinge having a hinge azimuth orientation at approximately 90° or a hinge line perpendicular to the sight line of a viewer. The hinge is designed so that the dual display information handling system may be arranged in an open position at approximately 305° relative angle between the two display screens and where the front of one display screen is viewable on one side while the other display screen is viewable on the other side. In the tent mode orientation example embodiment, a range of relative hinge angles between approximately 180° and 350° between the two display screens is contemplated for tent mode orientation. When both display screens are to be viewed with images in landscape orientation from opposite sides, tent mode orientation may take effect. Portrait mode viewing is also contemplated in some embodiments of tent mode orientation. Note that the relative hinge angle may overlap with other embodiments, such as one embodiment of media display mode orientation or even single or dual table mode. Tent mode orientation mode similarly may not be viewed simultaneously by the same viewer. Further tent mode orienatation mode may present identical or different graphical media content on both sides in some embodiments. As such, these considerations of the tent mode orientation operation may affect color brightness usage time measurements. In other aspects, whether or what type of color shift management may be implemented may be influenced by detection of tent mode orientations according to embodiments herein. Since continuity of content simultaneously viewable on both display screen sides is less likely, color shift management measure may not be implemented across both display screen sides. It can be appreciated that additional usage mode orientations for a dual display information handling system may be determined and impact the implementation of the dual display color shift management system according to embodiments herein.

Each orientation mode is not necessarily separate from other orientation modes in available ranges of relative angle or hinge azimuth orientation of the hinge. Moreover, all angles including hinge azimuth angles relative to a viewers line of sight are approximate and may vary substantially. For example, in hinge azimuth angles a variance may be up to +/−30°. This is due, for example, to variation of a viewer's position while using the dual display information handling system including substantial range of view point, head position, and body position. Relative hinge angles may also vary by several degrees of orientation and may be set to any range of relative angles that meet the functional needs of the usage mode. The usage mode selected by the display dual display color shift management system may depend on the working software application context of the running software applications as well as input from sensors detecting states of usage activity of the dual display information handling system.

FIG. 9A illustrates a light input degradation model relative to a particular burn-in period for a particular type of display screen. FIG. 9A may include data from multiple tests of display screens of a particular type. This data may be averaged or smoothed to provide an expected light input brightness degradation model over several months for the pertinent type of display screen. For example, FIG. 9A may represent an expected burn-in color brightness reduction for an OLED display screen from a particular manufacturer or a particular lot of manufacture. FIG. 9A may represent expected burn-in brightness reduction for displays categorized by a similar set of operating specifications in other aspects. FIG. 9A shows a brightness percentage level along the x-axis 904 which may represent a percentage degradation relative to an original factory level or relative to a maximum available level of brightness when first manufactured. In some cases, color brightness levels at initial levels for manufactured display screens, such as OLED screens, may have a maximum level of nits set at a lower level of brightness than the panel can display to permit for adjustment overhead. For example, a 250 nit panel may be set at 220 nits maximum initially to allow for an upward increase in brightness levels of one or more color components. This may allow for brightness adjustment and color shifting while maintaining a consistent overall maximum brightness of the display panel. The percentage degradation may be linked to the initially set maximum level of brightness in some embodiments.

The y-axis 910 of FIG. 9A shows a burn-in duration in months in the example embodiment. In the example embodiment of an expected burn-in brightness degradation, which may also indicate a color shift, of FIG. 9A, there are two expected generalized burn-in rates of change in brightness percentage are shown over the burn-in period. There is an initial burn-in rate 915 during an initial phase, and a second burn-in rate 920 during a second phase. This has been discovered to be a common burn-in trend measured in display screens, and in particular during burn-in of OLED display screen panels. In the example of FIG. 9A, the expected burn-in period is shown to be nine months with an initial phase at about three months and a second phase between months three and nine. The averaged burn-in data trends determined for particular display screen panel types, as in FIG. 9A, may be used to establish an expected brightness degradation model to predict burn-in effects. With the expected brightness degradation model, operation times assessed for display screen sides or for particular pixels or pixel arrays may be used to predict differences in brightness degradation rates which also may be related to color shifts. It is understood that the burn-in period and the phases may be of any duration and several phases may be utilized for the expected burn-in values utilized by a dual display color shift management system in some embodiments. Further, the initial burn-in phase and second phase are shown having linear brightness degradation, however in other embodiments any curvilinear expected brightness degradation rate for any number of burn-in phases may be utilized depending on measurement data taken by a manufacturer or a dual display color shift management system to create an expected brightness degradation table or graph for particular embodiments of the dual display color shift management system. Also, known differences of rates of brightness reduction may be applied to different color components. For example, a blue color component may be known to contribute to overall brightness reduction by a substantially greater amount than red or green color components. This may also be used with the expected brightness degradation table or graph to predict color shifts as well.

In yet other embodiments (not shown), the brightness degradation models of expected brightness degradation may further include measured brightness degradation levels specific to individual color components of the display screen. For example, expected burn-in degradation models may be established for each of the blue, green, and red color components respectively from color specific measurements of manufactured display screen panel types. In various embodiments, the brightness percentage levels 904 and data during phases 915 and 920 shown in FIG. 9A may be particular to any one color component of the display screen or may be particular to a combination of color components as opposed to general brightness levels. Further, instead of the brightness percentage levels shown in FIG. 9a at 904, estimated color shift models using color heat level percentages of shift relative to initial color heat levels for a test display color such as white may be used with the dual display color shift management system in some embodiments.

In yet other aspects, the expected brightness degradation models, similar to that depicted in the example embodiment of FIG. 9A, may differ for sections or portions of display screen differently such that those with typically higher burn-in rate hotspot locations may have a different burn-in rate model curve than portions of the display screen less likely to have color brightness hotspots. In this embodiment, the display screen may be partitioned into portions of any number or any size or shape. For example, if hotspots may be expected to more likely appear at center areas of a display screen or along edges where task bars or other consistent displayed features may be located. The partitions may be numbered and sized accordingly to reflect particularized burn-in rate model data for those partitioned parts of either or both display screens in terms of brightness usage levels or color heat levels. Further, the expected burn-in model used for a display screen type need not be specifically a graphical representation, but may instead be a data set or table accessible by a dual display color shift management system in some embodiments. Other variations to the possible combinations of or differences of expected burn-in rate models used by the dual display color shift management system according to various embodiments herein are also understood to be implemented in yet other aspects of the operation of the systems herein.

Figure 9B:
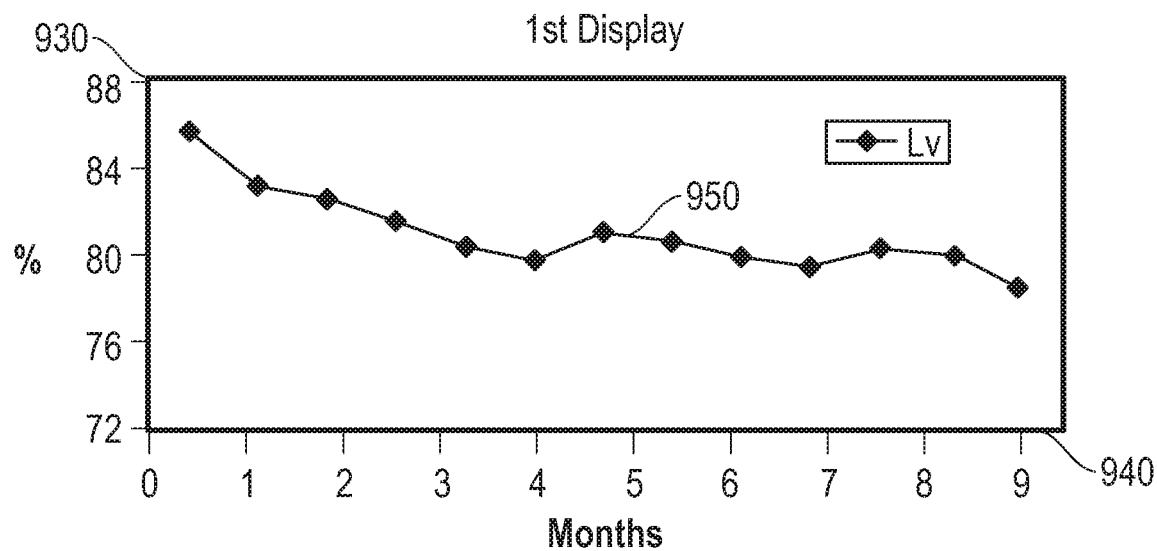
FIG. 9B illustrates a graphical plot illustrating example dual display information handling system non-uniform color shift of a first display screen side according to an embodiment of the present disclosure.

FIG. 9B illustrates an example set of measured data for burn-in brightness degradation for a first display screen according to example embodiment measurements of color brightness levels during a burn-in period. The x-axis 930 shows the percentage of brightness relative to some initial brightness level such as when the panel was first manufactured. In some examples, the percentage of brightness may be relative to the manufacturer maximum brightness setting. The maximum brightness setting may leave room for adjustment overhead in some example embodiments. The brightness percentage levels 930 and data 950 shown in FIG. 9B may be particular to any one color component of the display screen or may be particular to a combination of color components. Further, the brightness percentage levels shown in FIG. 9B at 930 may be color heat levels relative to initial color heat levels for a test display color such as white in some embodiments. The y-axis 940 shows a burn-in time period over months.

Figure 9C:
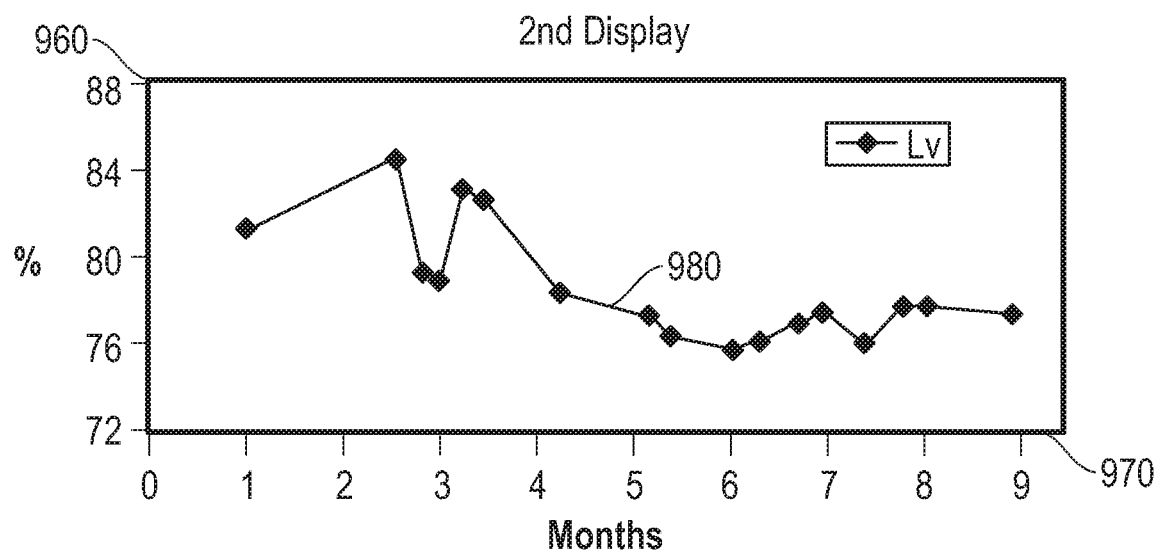
FIG. 9C illustrates a graphical plot illustrating example dual display information handling system non-uniform color shift of a second display screen side according to an embodiment of the present disclosure.

FIG. 9C illustrates an example set of measured data for burn-in brightness degradation for a second display screen according to an example embodiment. The x-axis 960 of FIG. 9C also shows the percentage of brightness relative to some initial brightness level such as when the panel was first manufactured. The percentage of brightness may be relative to the manufacturer maximum brightness setting leaving room for adjustment overhead in some example embodiments. The brightness percentage levels 960 and data 980 shown in FIG. 9C may be particular to any one color component of the display screen or may be particular to a combination of color components. Further, the brightness percentage levels shown in FIG. 9C at 960 may be color heat levels relative to initial color heat levels for a test display color such as white in some embodiments. The y-axis 970 shows a burn-in time period over months.

The burn-in brightness degradation of the second display screen may be compared to that of the first display screen in a dual display screen information handling system to show the differences in burn-in that may occur and the effect on burn-in on the brightness levels between the two display screen sides. This difference in burn-in brightness degradation levels shown in FIGS. 9B and 9C may be measured brightness levels for separate display panels on the two display screen sides according to embodiments herein. It can be appreciated, in other embodiments, brightness levels, similar to measurements shown FIGS. 9B and 9C, may be measured for different burn-in rates for portions of a single display screen side. The differences between the measured display screen sides brightness degradation levels in FIGS. 9B and 9C may be used by the dual screen color shift management system in some embodiments to make color adjustments. For example, the dual screen color shift management system may make color shift adjustments to one or both display screen sides toward the other to balance overall brightness levels displayed between the display screen sides for consistency. In other embodiments, color shift adjustments to brightness of particular color components may be made by the dual screen color shift management system to shift color heat levels.

Figure 10:
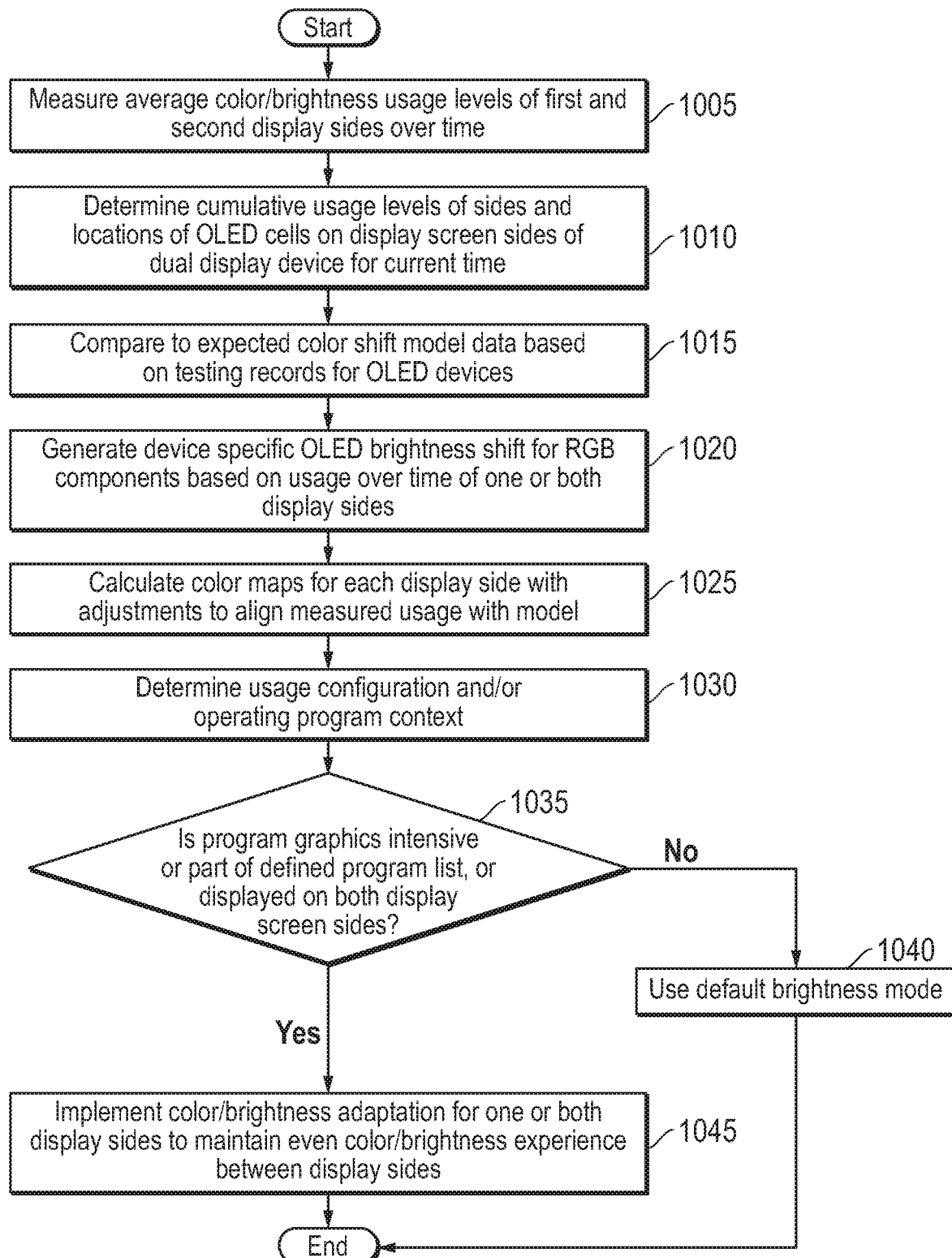
FIG. 10 is a flow diagram illustrating an example system for determining color shift management between sides of a dual display information handling system with display burn-in variation according to an embodiment of the present disclosure.

FIG. 10 illustrates a method of implementation of color shift management which may be performed according to disclosed embodiments. The method may be performed by some combination of controller 120 (FIG. 1) and GPU 106 (FIG. 1) or other processor executing machine readable instructions related to blocks 1005-1045. Some blocks may be omitted and other instructions included that may not be depicted in FIG. 10. Further, some blocks of FIG. 10 may be varied according to embodiments disclosed herein.

The method may start and proceed to block 1005 where the graphics system may report data to the dual display color shift management system according to embodiments herein. In one example embodiment, the dual display color shift management system may receive the amount of time of operation of each display screen side. In one example embodiment, each display screen side may be OLED display screen panels. The amount of operation time of each display screen side may be received from the graphics systems supporting each display screen side. For example, the GPU or other controller supporting and controlling display of content on one or both display screen sides may report "on" times for those display screen sides. The graphic system may also track other specification metrics of each display screen side when displaying images. This data may include additional particulars as to operation time for relative to sections or portions of pixel arrays of any shape or size within each display screen side in some embodiments. In yet further embodiments, the graphics systems of each display screen side may report pixel-specific operational time data across pixels within each display screen side.

Other operational specification data may also be reported and recorded for the display screen sides, recorded for portions thereof, or recorded for individual pixels. Other operational specification data may include reporting on brightness level settings during operation which may include reporting of brightness levels of individual color components over specific time period. Some specification data reported may include percentages of usage of individual color components for a display screen side, for specific pixel arrays or portions, or even for individual pixel operation. Data relating to operation times for each display screen side may also include orientation data to indicate graphics intensity levels for operation on one or both display screen sides in some embodiments.

The dual display color shift management system will determine cumulative usage levels for display screen sides or by pixels or arrays of pixels for locations in the display screen sides. In an example embodiment, the if the data is gathered per pixel or per arrays of pixel areas on display screen sides, the dual display color shift management system may also have data indicating locations for the pixels or arrays of pixels being tracked. In such a case, color shift management measures may be applied at specific locations.

For the tracked, cumulative data of operational time and other specification data of display screen side operations as described, the dual display color shift management system may assess averages for certain metrics recorded. This may be true if time of operation or other specification data is collected as samples such that averaging over total time of operation may be necessary. In other examples, if data is recorded on a pixel by pixel basis, some averages over arrays of pixel for an area or for an entire display screen side may be useful in some determinations by the dual display color shift management system to assess zones or areas of display screen sides. This may be useful in identifying areas which may experience hot spots of greater use or areas which experience less color brightness usage levels. In some other embodiments, data such as brightness levels or color component brightness levels may be averaged over time based on spot data collection points to provide useful metric of color brightness usage trends over time. The average color/brightness usage levels over time may be assessed for each of the display screen sides or for any portions thereof including down to a pixel level in various embodiments.

Proceeding to 1010, the dual display color shift management system may determine current cumulative usage levels similar to one or more metrics those recorded above in 1005. The current cumulative usage levels at a current time may be used to gauge for potential application of color shift management measures. The dual display color shift management system at 1010 will retrieve current cumulative levels of color brightness usage with respect to cumulative operational time for the dual display information handling system upon a current determination to assess for color shift management. In at least one embodiment, cumulative operational "on" time for each display screen side, or portions thereof, may be assessed. For example, assessment per individual pixels or defined pixels arrays at locations in the display screen sides will be assessed.

Upon determining the current overall color brightness usage values at a current assessment time, the "on" time brightness data or color component brightness data levels may be then compared at 1015. The dual display color shift management system may correspond the current levels of cumulative operational time of usage with a point in time of a burn-in period for a display screen panel along the expected color shift model. In some embodiments, the expected average brightness level model values may used as derived from the relative cumulative overall operational time of the pixels of the display screen sides at the current assessment time. This may provide an expected color brightness usage level along the burn-in time period for comparison between pixels at locations or between display screen sides. Similarly, cumulative brightness levels for individual color components, such as averages attributed to pixels, arrays of pixels or to each of the display screen sides may be compared. Such data may be used to adjust current overall color brightness usage values of pixels, portions of the display screen sides, or the overall display screen sides.

In other embodiments, the cumulative "on" time for a display screen side or one or more pixels thereof may yield an expected color brightness degradation value from the corresponding expected color shift models for comparison to where along the burn-in period the overall dual display information handling system has progressed based on usage of the system. As described, the expected color shift models for the dual display color shift management system may be provided from specification testing of the display screen type. The expected color shift models may include, as illustrated above in FIG. 9A, an overall expected degradation of brightness from the factory levels through a duration of a burn-in period. In some embodiment, the expected color shift models may presume ratio of degradation among the color components of red, green and blue in the overall brightness degradation. For example, the blue component of the RGB brightness levels typically has accelerated burn-in degradation relative to green or red. This accelerated burn-in degradation of blue may cause a shift toward the other two colors and resulting in a yellowing of the display screen during burn in. In other embodiments, the expected color shift models may include manufacturer provided detail on brightness degradation levels that have specific data for expected degradation for each color component. In OLED display systems the color components are red-green-blue. This color component specific expected brightness degradation model may then be compared to operation "on" time recorded for each color component. In other aspects, the current overall color brightness usage levels for the overall "on" time of a dual display information handling system may be compared with the data of expected color component brightness levels from color component "on" times recorded up to the current time. This data may then be compared to expected color shift models for the color components to determine what color component brightness levels should be at the current burn-in time for the overall system in some aspects.

At 1020, the dual display color shift management system may assess levels of deviation from the expected color shift models for each display screen side and determine if one display screen side has deviated more substantially than the other display screen side. If there is deviation from the expected color shift model values for the current assessment time, then color shift management measures may be triggered in one embodiment. In another embodiment, each display screen side must deviate in amount of color brightness usage time values or cumulative "on" times differently from one another to trigger color shift management measures. The color shift management measures may shift the color brightness levels of one or both of the display screen sides. In an aspect, if both display screen sides deviate from the expected color shift model by the same amount, which is above or below the expected brightness degradation levels for the current assessment time, then no color shift management measures may be taken since the color shift to both display screen sides is expected to be near equal.

When the display screen sides brightness usage time, also referred to "on" times for display screen sides, indicates a likely brightness degradation deviation by more than a threshold amount of difference, then equalizing color shift management measures may be triggered for one or both of the display screen sides. The threshold amount of difference may be a difference determined as between display screen sides in one embodiment. The threshold amount of difference may be a difference determined between pixel array areas for locations on one or more display screen sides in other embodiments. In yet other embodiments, the threshold difference may be relative to an expected value of overall dual display information handling system "on" time or corresponding expected color brightness degradation value. This latter threshold may be made separately for each display screen side or for particular pixel array locations.

In one example embodiment a threshold percentage of brightness degradation difference must be more than 2% between the two display screen sides to be noticeable and thus triggering color shift management measures. In other embodiments, a higher or lower difference between the display screen sides may be tolerated, and the threshold percentage difference may be set at any corresponding level, such as by a percentage, accordingly. For example, a threshold deviation of somewhere between 1% to 4% in brightness degradation between the display screen sides due to operational time based on the expected color shift model may be used in some embodiments. In certain aspects, where the expected color shift model has particularized color component data, a percentage threshold difference for any or multiple color components may be used to trigger color shift management measures.

When a difference between the burn-in brightness degradation levels of the display screen sides is determined to be above threshold difference values from one another or from the expected color shift model data, then the dual display color shift management system may determine a brightness adjustment may be needed for one or both display screen sides. In one aspect, the brightness overhead may be used to increase brightness of a display screen side or portion of a display screen side to adjust for a larger brightness degradation level due to color brightness usage amounts or "on" times assessed to bring that brightness level or color component brightness level up to an equalizing level.

In other aspects, the brightness of a display screen side, or portion, may be decreased toward a lower level of brightness to equalize the display screen sides or pixel array locations. The decreased brightness may be applied to color components to achieve color components shifts toward one color component with a larger degradation level. In doing so for some embodiments, individual color component brightness level data may be available for expected brightness degradation models such that decreased brightness adjustment is made for color components with less degradation due to cumulative "on" time to shift the color temperature. For other embodiments, the dual display color shift management system may use assumed ratios of color component degradation associated with overall brightness degradation during burn-in and apply increases or decreases in color brightness levels to shift the color brightness levels of one display screen side more toward the levels of the other display screen side. For example, the display screen color brightness degradation model of FIG. 9A will likely have a large component of brightness degradation attributable to blue color component degradation for OLED display screens.

When the brightness degradation results in a color shift that is particular to just one color component or multiple color components degrading faster than others, color shift management measures may involve alteration to Vdd levels used to illicit lower brightness amplitudes in remaining, brighter color components relative to one or more degraded color components. The color component shifts may be made across a display panel side, on a pixel by pixel adjustment, or to arrays of pixels defining portions of display panel sides. The magnitude of the color component brightness shifts may be made in accordance with shifting the color shift of pixels of a display screen sides to equalize with brightness levels of pixels of the opposite display screen side in some embodiments. In yet other aspects, the dual display color shift management system may adjust color brightness levels of both display screen sides toward one another or toward a level of expected brightness degradation at the current timepoint in the burn-in period in variations on embodiments of the above.

Proceeding to 1025, the color component brightness shifts determined by the dual display color shift management system at 1020 may be pixel dependent, pixel area dependent, or display screen side dependent. Application of the color component brightness shifts may involve a re-calibration of color maps for each display screen side to reflect changes triggered by the color shift management measures to be implemented by the dual display color shift management system at the current time. Such re-calibrated color maps for each display screen side or portions thereof will align the expected color brightness usage levels reflected from measured operation times of each side. This will align the color brightness levels or heat maps of each of the display screen sides such that differences will not be noticed by a user when the color component brightness shifts are applied during operation. Similarly, pixels or arrays of pixels may be adjusted to align the color brightness across display screen sides in other aspects as well.

Flow may proceed to 1030 in an example embodiment. The dual display information handling system may not implement the color shift management measure to implement recalibrated color component brightness shifts in some embodiments before determining whether such color shift management measures are needed at the current assessment time. The dual display color shift management system may receive data about the usage configuration of the dual display information handling system or the operating program context for applications displaying content on the two (or more) display screen sides. The usage configuration at the current assessment time may be received from a usage mode selector system. In other aspects, the dual display color shift management system may directly receive data from various sensor systems for orientation of the first and second display screen sides with respect to one another and orientation with respect to a reference direction or a user to determine usage configuration orientations as described in various embodiments herein. In another aspect, the software application context may be determined by the dual display color shift management system via the operating system and reporting of software systems. The software application context may be utilized for assessment of graphics operations between display screen sides or graphics intensity categorization of operating software programs as described in embodiments herein. In some aspects of the present embodiments of FIG. 10, determining configuration or operating program context may occur before assessment of any color brightness shift adjustments that may be currently needed. In other embodiments, ongoing assessment of usage times or "on" times may be conducted, but any color shift management measures may be dependent on assessment of current configuration orientation or operating software contexts.

At 1035, the dual display color shift management system may determine whether a usage configuration orientation will allow both display screen sides to be simultaneously viewed in that brightness degradation inconsistencies may be noticeable by a user. If the usage configuration orientation does not involve both display screen sides being viewable simultaneously such that inconsistencies between display screen sides would be noticeable, then flow proceeds to 1040. If, however, the usage configuration orientation does involve both display screen sides being viewable simultaneously such that inconsistencies between display screen sides would be noticeable, then flow proceeds to 1045.

Similarly at 1035, the dual display color shift management system may determine whether an operating program is categorized as graphics intensive in that brightness degradation inconsistencies may be noticeable by a user. If the operating programs are not graphics intensive such that inconsistencies between display screen sides would be noticeable, then flow proceeds to 1040. If, however, the operating programs are graphics intensive such that inconsistencies between display screen sides would be noticeable, then flow proceeds to 1045.

In some aspects at 1035, either assessment of usage configuration orientation mode or operating program context may be used to determine whether inconsistencies between display screen sides would be noticeable before determining whether color shift management measures should be implemented. In other aspects, a combination of usage configuration orientation mode or operating program context may be used to determine whether inconsistencies between display screen sides would be noticeable. For example, if a double tablet orientation is determined, it may be dependent on whether both display screen sides are displaying continuity of content or colors by the software program context before determining if color shift management measures are to be used. Similarly, while book mode may suggest side by side viewing and similar content on both display screen sides in most usage cases, some software application contexts may determine that the display screen sides display different content such as two separate software applications multi-tasking on each side. It can be appreciated that other usage mode orientations, such as laptop mode, may similarly have variations based on software application context.

At 1040, the dual display color shift management system will not expend processing resources or alter color component brightness levels above or below default brightness levels in the factory-set operation mode or color maps since inconsistencies between the display screen sides would not be viewable or perceived by a user. In that case, color shift management measures may not be implemented between the two display screen sides unless the usage configuration or the software program context changes.

At 1045, if the usage configuration orientation does involve both display screen sides being viewable simultaneously or if the operating programs are determined to be graphics intensive (including having side by side content or color display similarities) such that inconsistencies between display screen sides would be noticeable, the color brightness shift adaptation determined by the dual display color shift management system will be implemented. Recalibrated color maps may be loaded for use by the supporting graphics system or systems for each of the display screen sides. The color shift management measures will then adjust brightness, or color component brightness, for some portion or all of at least one display screen side in an embodiment. The color shift management measures may be implemented to even the color brightness experience as between the two display screen sides. At this point the process may end until a change in configuration orientation or software context is detected or a new cycle of operation for the dual display information handling system occurs such as a new start up event or a new wake from sleep event. It is understood as well that in some embodiments the operation time and brightness levels during operation of the current assessment time will be measured and recorded by the dual display color shift management system for later reference and future color shift management. This may include recording data of adjusted brightness levels utilized pursuant to the color shift management measures.

Figure 11:
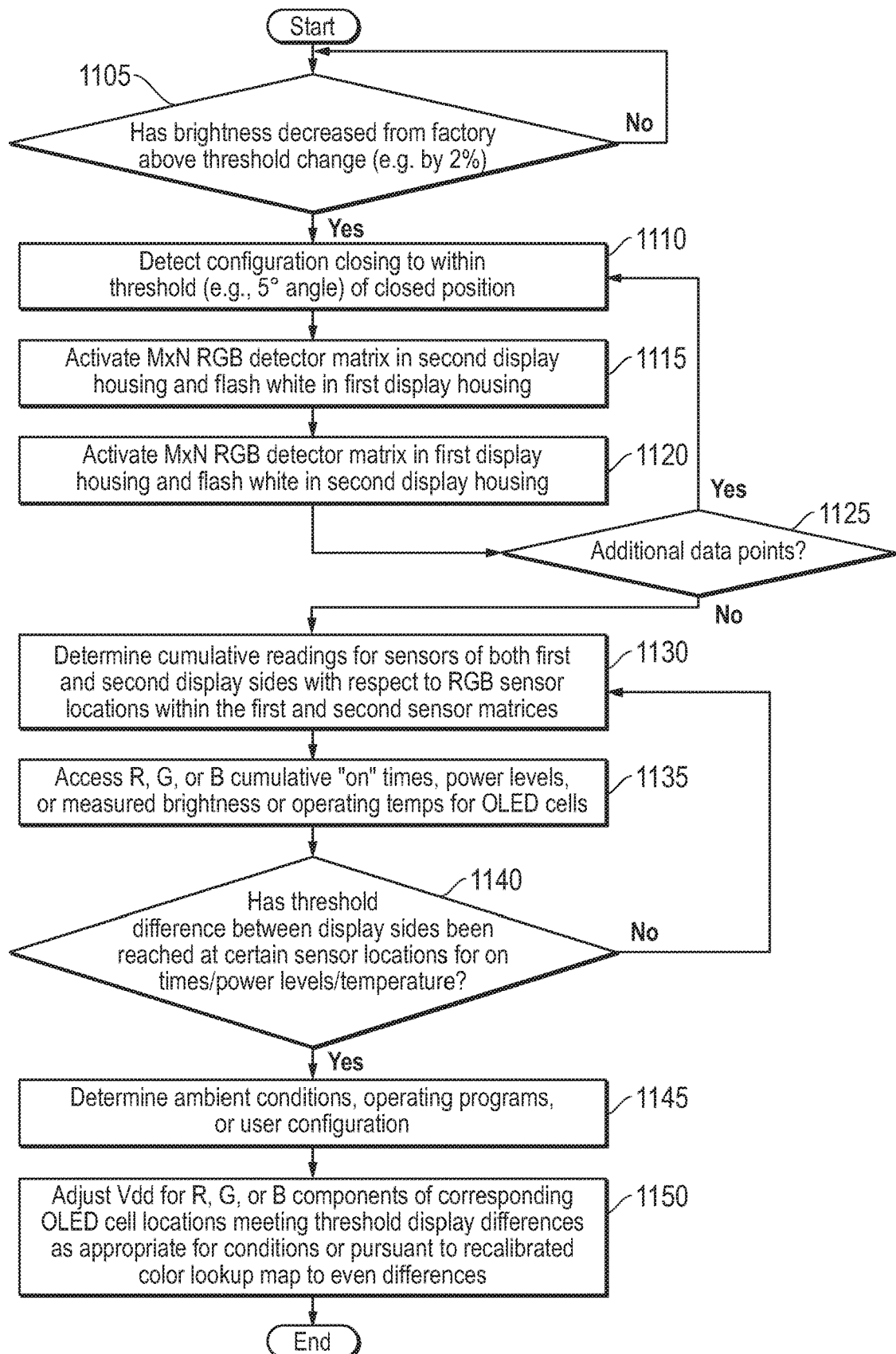
FIG. 11 is a flow diagram illustrating another example system for determining color shift management between sides of a dual display information handling system with display burn in variation according to an embodiment of the present disclosure.

FIG. 11 illustrates another method of implementation of color shift management which may be performed according to disclosed embodiments. The method of claim 11 may be performed by some combination of controller 120 (FIG. 1) and GPU 106 (FIG. 1) or other processor executing machine readable instructions related to blocks 1105-1150. Some blocks may be omitted and other instructions may not be depicted in FIG. 11 and some blocks may be varied according to any of several embodiments disclosed herein. The method may start and proceed to block 1105.

At 1105, the dual display information handling system may make an assessment of whether brightness will have decreased more than a threshold level for either of the two display screen sides. This threshold level decrease may be relative to the other display screen side, relative to compared pixel array locations, or between a display screen side and an expected brightness degradation model based on operational "on" time. In one example embodiment, this change may be determined based on cumulative operational time that has passed during a burn-in period, and the brightness decrease level may be assessed from an expected color shift model for one or both of the display screen sides. In some embodiments, a determination may be made via RGB sensors in detecting color brightness levels and comparing those to an initial factory level.

If no brightness decrease has occurred at 1105, flow will return to 1105 where the dual display color shift management system will continue to monitor usage time levels or take RGB sensor brightness data to determine if a threshold change may have been reached. In an embodiment, a threshold decrease of 2% may be used or some other value potentially noticeable by a user. For example, in some embodiments, a threshold decrease from an initial factory level may be any value between 1% and 4%. In this way the dual display information handling system will begin processing and implementation upon reaching a level of change that could be noticeable by a user.

If a brightness decrease has occurred more than the threshold level, flow will proceed to 1110 where the dual display color shift management system will conduct measurement of brightness levels via the RGB sensors for purposes of assessing whether possible color shift management measures are needed between display screen sides or among portions of each display screen side. At 1110, data from orientation sensors will detect the relative position of a first display screen side to a second display screen side to determine when a usage configuration orientation is approaching or has reached an almost-closed threshold angle level between the first and second display screen sides. For example, discussion of FIG. 4 above describes several examples of an almost-closed orientation and potential threshold angle levels which may be used to trigger RGB sensor test measurements in some embodiments.

The orientations sensors may operate via a sensor hub or directly with the dual display color shift management system as is understood from various embodiments described herein or understood in the art. In some embodiments, the dual display information handling system may have a usage mode selector that detects orientation modes from received orientation sensor data of various types. The usage mode selector may determine orientation and location of content automatically such as for placement of windows on the first and second display screen sides or portrait versus landscape orientations. In an aspect, the dual display color shift management system may work with the usage mode selector system for interpretation of an almost-closed orientation in some embodiments. The dual display color shift management system will determine when an indication has been received of whether the dual display information handling system has reached an almost-closed threshold angle level. When the first and second display screen sides close to or below an almost-closed threshold angle level, flow may proceed to 1115 where steps for taking RGB sensor measurements of each of the first and second display screens may begin. It is understood that while an almost-closed orientation is used in the described embodiment, an initial-open orientation detection may be used upon opening a dual display information handling system such that the first and second display screen sides are facing one another for test measurements while the dual display information handling system if first being opened in other embodiments. In the initial-open embodiment, detection of an initial opening of the display screen sides may trigger RGB sensor measurements which may occur before the display screen sides reach a threshold angle level relative to one another.

Any threshold angle level may be used as described in embodiments relative to FIG. 4 above for an almost-closed embodiment or the maximum angle for an initial-open orientation in other embodiments. For example, a 5° angle may be used in some aspects as an almost-closed threshold angle. An angle may be selected such that the first and second display screen sides are facing or nearly facing each other. In an example embodiment, any amount of angle may be used, but some adjustment to RGB sensor detection may need to be made for portions of the first and second display screens that are farther away than others when the display screens are configured at an almost closed angle. For example, along a hinge edge, the first and second display screen sides may be closer to one another than they are along the leading edges of the display screen sides. This may yield brightness measurement variation that may require tuning of either the test flash or the RGB sensing. Tuning of the RGB sensors or the test flash may be conducted to adjust for such distance differences due to the almost-closed angle used if variation is significant in some aspects.

At 1115, the dual display color shift management system will activate the RGB sensor or sensors on a second display screen side and initiate a test flash on the first display screen side. Flow will then proceed to 1120 where the dual display color shift management system will activate the RGB sensor or sensors on the first display screen side and initiate a test flash on the second display screen side. In an example embodiment, each display screen side may use an M×N RGB detector matrix as described in embodiments above. Further, the test flash may include any series of test flashes including for different colors and durations. In an example embodiment, a test flash of white light may be initiated from each display screen side. It is understood that the sequence of testing may be varied such that the first or second test screen may be tested via a test flash or test flashes in any order. The method will proceed to 1125, where the dual display color shift management system will determine if additional data points are needed such as additional colors or another set of test flashes to determine brightness color degradation levels. If so, flow will return to 1110 to determine if the configuration orientation is still within the almost-closed orientation and proceed to take additional test flash measurements. If additional data points are not needed or the orientation has changed, flow may continue to 1130. In some embodiments described herein, the dual display color shift management system may prompt a user to configure the dual display information handling system in an almost-closed orientation to conduct brightness color shift testing in accordance with the above.

At 1130, the dual display color shift management system will assess the current cumulative measurement levels for detected RGB brightness levels among both the first and second display screens. In particular, with an M×N RGB sensor reading, RGB brightness levels may be monitored for particular pixels or pixel array locations that correspond to locations in the opposite M×N RGB sensor matrices. Proceeding to 1135, the dual display color shift management system may also continue to monitor and access usage time levels and that data may be recorded for operational "on" time for each color component. Further power levels relating to setting for brightness levels for RGB color components may also be recorded in accordance with embodiments herein. This data may be utilized in addition to or along with the M×N RGB sensor brightness data or color heat map operating temperature for each of the OLED pixels or pixel cell arrays in the first and second display screen sides. The combination of RGB sensor measurements and color brightness usage time levels may be utilized to determine if a threshold difference of screen brightness, a threshold difference of color component brightness, or a threshold difference of a color temperature shift may have been reached. For example, heat map color temperature values may be derived from RGB brightness measurements in some example embodiments.

At 1140, the dual display color shift management system will determine whether a threshold difference between the color brightness levels or heat map color values has been reached between any compared pixel arrays. In some embodiments, comparison between display screen sides may be assessed for pixel array differences. In other embodiments, the differences may be detected for differences among pixel arrays around various locations of the first and second display screen sides. Utilization of measurements of color component "on" time, power levels operating to set brightness levels, and color brightness levels or heat map temperature values may be assessed for differences sufficient to trigger color shift management adjustments.

If a threshold has not been reached for differences between display screen sides or between specific pixel arrays whether on the same display screen side or opposite display screen sides, flow returns to 1130 where the dual display color shift management system will monitor differences between heat map color temperature values or color brightness levels. In some embodiments, the monitoring may be continuous. In other embodiments, the monitoring may be periodic such as upon receipt of new RGB sensor matrix data or conducted at dual display information handling system operational cycles such as upon start up or wake from a sleep state. In yet other embodiments, monitoring by the dual display color shift management system may occur periodically with periods linked to passage of calendar time periods or reaching of levels of operational "on" times for one or both display screen sides. Other cyclical or continous cumulative sensor reading assessments may be made by the dual display color shift management system according to various embodiments as understood by those of skill.

If at 1140, the dual display color shift management system determines that a threshold difference between the color brightness levels or heat map color values has been reached between display screen sides or any pixel arrays, the dual display color shift management system may implement color shift adjustment measures. As described in embodiments herein, threshold differences between display screen sides or pixel arrays may need to exceed a level noticeable by a user viewing both display screen sides or both pixel array area locations on one or more display screen sides. Several example embodiments describe noticeable differences herein or are understood. For example, a brightness level difference of 2% may be used in one example embodiments as discerned between display screen sides or between pixel array locations in proximity to one another. Any percentage may be used and in some example embodiments a difference of anywhere between 1% and 4% may be selected as a threshold level.

In other aspects, color brightness differences for particular color components may be assessed for threshold difference levels specific to those color components. In one example embodiment for OLED display screens, the blue color component frequently degrades the most quickly and changes to the blue color component brightness levels may be used as a threshold for triggering color shift adjustments. Other measured brightness level differences, power levels, or brightness level differences based on cumulative "on" times and expected color models may be also used. In some embodiments, heat map color temperature differences or chromaticity differences may be used to discern a threshold difference in display screen sides or pixel array locations for triggering color shift adjustment. A threshold difference may be a few hundred Kelvin or even 1000 K shift in chromaticity. For example, a low difference tolerance for the dual display color shift management system may utilize a threshold difference of 100 K color temperature or a 1% brightness difference in various example embodiments. A high difference tolerance for the dual display color shift management system may utilize a threshold difference of 1000 K color temperature or a 5% brightness difference in various example embodiments.

The low or high difference tolerances may depend on noticeability of color shifts doe to display panel types, operating software context data regarding side-by-side display content continuity or color similarities, or ambient light levels. In some embodiments, operating software context data received may alter the tolerance levels applied by the dual display color shift management system such that a low difference tolerance may be applied when content is continuous and viewable across both display screen sides or side-by-side colors are displayed. In other aspects, some software applications have high intensity graphics requirement where color acuity is important. In other aspects, a high difference tolerance threshold may be applied when received software program context data suggests similarity between display screen sides but that side-by-side colors or displayed content continuity are not as substantially close, or graphics intensity requirements are not as substantially high during usage. For example, some software contexts may utilize plural display options with similarities between display screen sides of displayed content or colors, but not identical color palettes such that variations of color shifts would be noticeable at lower levels in some embodiments.

In other embodiments, the ambient light levels detected may alter the tolerance levels applied by the dual display color shift management system such that a low difference tolerance may be applied at low ambient light levels while a high difference tolerance threshold may be applied at high ambient light levels. Low ambient light levels may include operation within a darkened room or at nighttime in some embodiments. In other embodiments, operation inside under normal room lighting may be considered low ambient light levels while high ambient light levels may include highly lit inside areas or bright, sunlit outdoors operation. Further it is understood that several levels of ambient light levels may be detected and utilized to provide for application of multiple difference thresholds in other embodiments.

If at 1140, the dual display color shift management system determines that a threshold difference between the color brightness levels or heat map color values has been reached, flow may proceed to 1145. At 1145, the dual display information handling system may not implement the color shift management measures to implement recalibrated color component brightness shifts in some embodiments if the differences would not be viewable or noticeable. The usage configuration of the dual display information handling system or the operating program context for applications displaying content on the two (or more) display screen sides may be determined before color shift management adjustments are implemented. In yet other embodiments, ambient light levels may be determined before implementing recalibrated color component shifts since extremely high ambient light levels may reduce noticeability or wash out differences between display screen sides or pixel array areas whereas low ambient light levels may make differences particularly noticeable.

At 1145, the usage configuration orientation at the current assessment time may be provided by a usage mode selector system or from various sensor systems for the first display screen side relative to the second display screen side. In some embodiments, orientation with respect to a reference direction or a user may be determined as well which is described in various embodiments herein for purposes of determining orientation relative to a user. The software application context may be determined by the dual display color shift management system via the operating system and reporting of software systems context which may be used to assess graphics operations on each of the display screen sides. In example embodiments, graphics intensity categorization may be provided including side-by-side continuity of content or colors displayed as described in embodiments herein. In some aspects of the present embodiments of FIG. 11, determining configuration or operation program context may occur before assessment of any color brightness shift adjustments. The determination of orientation and operating software context may occur before assessment of threshold brightness or color temperature differences between display screen sides or pixel array locations in advance to discern if the any color shift management measures are needed.

The dual display color shift management system may determine whether a usage configuration orientation will allow both display screen sides to be simultaneously viewed. Also assessment of the operating software program context may additionally be conducted as to whether an operating program is categorized as graphics intensive in that brightness degradation inconsistencies may be noticeable by a user between dual display screen sides or over one display screen side. If the usage configuration orientation does not involve both display screen sides being viewable simultaneously or if the operating programs are not graphics intensive such that inconsistencies between display screen sides would be noticeable, then no color shift adjustment may be implemented at 1150. If, however, the usage configuration orientation does involve both display screen sides being viewable simultaneously or if the operating programs are graphics intensive such that inconsistencies between display screen sides or pixel array locations would be noticeable, then color shift adjustment measures may be implemented at 1150.

At 1150, when the usage configuration orientation does involve both display screen sides being viewable simultaneously or if the operating programs are graphics intensive such that inconsistencies between display screen sides would be noticeable, a color brightness shift adaptation may be implemented by the dual display color shift management system. The dual display color shift management system will provide for a color shift adjustment of one or more color components of red, green, or blue as appropriate to even the display color temperature between display screen sides or pixel array locations for portions of the display screen sides in some embodiments. In other embodiments, a color shift adjustment of one or more color components of red, green, or blue may be made to balance differences in the color brightness levels between display screen sides or pixel array locations for portions of the display screen sides in other embodiments. The dual display color shift management system will provide for recalibration of pixel color maps utilized by the graphics system or systems for each of the display screen sides. The recalibrated color maps may be loaded to graphics memory for use by the supporting graphics subsystem or systems for each of the display screen sides or GPU data alterations may be implemented. The color shift management measures will then adjust brightness, or color component brightness for some or all of at least one display screen side to even the color brightness experience as between the two display screen sides.

The recalibrated color maps may be stored in non-volatile memory and applied upon start up of the dual display information handling system. In this way, recalibration may not need to occur at each session until another recalibration event is needed upon a color shift or brightness degradation difference threshold being detected and met. Upon an new color shift or brightness difference threshold being detected, recalibration and color shift adjustment may take place again according to various embodiments herein. At this point the process may end until a change in configuration orientation or software context is detected or a new cycle of operation for the dual display information handling system occurs. It is understood as well that in some embodiments the dual display color shift management system will continuously or periodically obtain RGB sensor measurements, pixel brightness operation time, and brightness levels and monitor for threshold level changes for later reference and future color shift management.

The blocks of the flow diagrams of FIGS. 10-11 or steps and aspects of the operation of the embodiments therein and discussed above need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description. Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A dual display housing information handling system comprising:
   a first display screen side having a first portion of a display screen;
   a second display screen side, hinged to the first display screen side, having a second portion of the display screen;
   a second display screen side RGB detector to activate and the first display to test flash;
   a first display screen side RGB detector to activate and the second display to test flash;

a controller to determine operating color temperature shift to detect burn-in differences from comparison of color temperature readings from the first display screen side RGB detector and the second display screen side RGB detector; and if the difference between operating color temperatures measured between the first portion of the display screen and second portion of the display screen reaches a threshold difference, the controller implementing display color shift management to provide adjusted color mapping data to adjust at least one color component of the first or second display screen side to balance the operating color temperatures between the first portion of the display screen and second portion of the display screen.

2. The dual display housing information handling system of claim 1, wherein the first portion of the display screen is a first display panel mounted in the first display screen side and a second portion of the display screen is a second display panel mounted in the second display screen side of the dual display housing information handling system.

3. The dual display housing information handling system of claim 1, further comprising:

the first display screen side RGB detector is a first M×N RGB detector matrix for detecting color brightness levels for a corresponding OLED cell matrix from the second display screen side;

the second display screen side RGB detector is a second M×N RGB detector matrix for detecting color brightness levels for a corresponding OLED cell matrix from the first display screen side.

4. The dual display housing information handling system of claim 1, further comprising:

a configuration sensor hub to detect closing configuration of the first display screen side to within a closing configuration threshold angle of the second display screen side and, if so, implementing color shift management.

5. The dual display housing information handling system of claim 1, further comprising:

the controller to compare a cumulative operating time of the first display screen side and a cumulative operating time of the second display screen side with an expected color shift model for display portions of the type used for the first display screen side and the second display screen side; and determine if threshold cumulative operating time of either the first or second display screen side has passed before activating the first display screen side RGB detector and second display screen side RGB detector.

6. The dual display housing information handling system of claim 1, further comprising:

the controller to determine a usage configuration of the first display screen side relative to the second display screen side of the dual display housing information handling system; and the controller implementing display color shift management to provide adjusted color mapping data if the usage configuration detected includes the first display screen side viewable simultaneously with the second display screen side by a user.

7. The dual display housing information handling system of claim 1, further comprising:

an ambient light detector to detect the ambient lighting condition level around the dual display housing information handling system; and the controller implementing display color shift management to provide adjusted color mapping data when the ambient lighting condition level does not exceed a light level threshold to overwhelm operation of the first display portion or the second display portion of the display screen when viewed by a user.

8. A dual display housing information handling system comprising:

a first display screen side having a first portion of a display screen;

a second display screen side, hinged to the first display screen side, having a second portion of the display screen;

the first display screen side including a first M×N RGB detector matrix for detecting color brightness levels for a corresponding OLED cell matrix in the second display screen side from a test flash of the second display screen side;

the second display screen side including a second M×N RGB detector matrix for detecting color brightness levels for a corresponding OLED cell matrix in the first display screen side from a test flash of the first display screen side;

a controller implementing display color shift management to determine differences in color brightness readings between a first OLED cell matrix location of the first portion of the display screen and a second OLED cell matrix location of the second portion of the display screen to compare operating color brightness degradation shifts to detect burn-in differences; and if a threshold operating color brightness shift difference level is measured between the first OLED cell matrix location and the second OLED cell matrix location, the controller to provide adjusted color mapping data to adjust at least one color component at the first or second OLED cell matrix location to balance the operating color brightness levels between the first and second OLED cell matrix locations.

9. The dual display housing information handling system of claim 8, wherein the first portion of the display screen is a first display panel mounted in the first display screen side and a second portion of the display screen is a second display panel mounted in the second display screen side of the dual display housing information handling system.

10. The dual display housing information handling system of claim 8, wherein the threshold operating color brightness shift difference is greater than a 3% difference in any measured color component between the first OLED cell matrix location and the second OLED cell matrix location.

11. The dual display housing information handling system of claim 8, wherein adjustment of at least one color component at the first or second OLED cell matrix location includes increasing brightness of that color component.

12. The dual display housing information handling system of claim 8, further comprising:

the controller to determine a usage configuration of the first display screen side relative to the second display screen side of the dual display housing information handling system; and the controller implementing display color shift management to provide adjusted color mapping data if the usage configuration detected includes the first display screen side viewable simultaneously with the second display screen side by a user.

13. The dual display housing information handling system of claim 8, further comprising:

the controller to determine a graphics intensity categorization of an application program operating on the first display screen side or the second display screen side of the dual display housing information handling system; and the controller implementing display color shift management to provide adjusted color mapping data if the graphics intensity categorization requires optimal color matching on both the first and second display screen sides.

14. A dual display housing information handling system comprising:
   a first display screen side having a first portion of a display screen;
   a second display screen side, hinged to the first display screen side, having a second portion of the display screen;
   a processor executing a configuration sensor hub to determine the usage configuration of the first display screen side relative to the second display screen side of the dual display housing information handling system;
   a second display screen side RGB detector to activate and the first display to test flash;
   a first display screen side RGB detector to activate and the second display to test flash;
   a controller to determine operating color temperature shift to detect burn-in differences from comparison of color temperature readings from the first display screen side RGB detector and the second display screen side RGB detector; and
   if the difference between operating color temperatures measured between the first portion of the display screen and second portion of the display screen reaches a threshold difference, the controller implementing display color shift management to provide adjusted color mapping data to adjust at least one color component of the first or second display screen side to balance the operating color temperatures between the first portion of the display screen and second portion of the display screen.

15. The dual display housing information handling system of claim 14, wherein the first portion of the display screen is a first display panel mounted in the first display screen side and a second portion of the display screen is a second display panel mounted in the second display screen side of the dual display housing information handling system.

16. The dual display housing information handling system of claim 14, further comprising:
   the first display screen side RGB detector is a first M×N RGB detector matrix for detecting color brightness levels for a corresponding OLED cell matrix from the second display screen side;
   the second display screen side RGB detector is a second M×N RGB detector matrix for detecting color brightness levels for a corresponding OLED cell matrix from the first display screen side.

17. The dual display housing information handling system of claim 14, further comprising:
   the configuration sensor hub to detect closing configuration of the first display screen side to within a closing configuration threshold angle of the second display screen side and, if so, implementing color shift management.

18. The dual display housing information handling system of claim 14, further comprising:
   the controller to compare a cumulative operating time of the first display screen side and a cumulative operating time of the second display screen side with an expected color shift model for display portions of the type used for the first display screen side and the second display screen side; and
   determine if threshold cumulative operating time of either the first or second display screen side has passed before activating the first display screen side RGB detector and second display screen side RGB detector.

19. The dual display housing information handling system of claim 14, further comprising:
   the controller implementing display color shift management to provide adjusted color mapping data if the usage configuration detected includes the first display screen side viewable simultaneously with the second display screen side by a user.

20. The dual display housing information handling system of claim 14, further comprising:
   an ambient light detector to detect the ambient lighting condition level around the dual display housing information handling system; and
   the controller implementing display color shift management to provide adjusted color mapping data when the ambient lighting condition level does not exceed a light level threshold to overwhelm operation of the first display portion or the second display portion of the display screen when viewed by a user.

* * * * *